US010171896B2

(12) United States Patent
Seo et al.

(10) Patent No.: US 10,171,896 B2
(45) Date of Patent: Jan. 1, 2019

(54) ELECTRONIC DEVICE WITH SIDE SPEAKER HOLE

(71) Applicant: SAMSUNG ELECTRONICS CO., LTD., Suwon-si, Gyeonggi-do (KR)

(72) Inventors: Jae-Il Seo, Suwon-si (KR); Kijae Kim, Seoul (KR); Yong-Seok Lee, Seoul (KR); Min-Su Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/805,462

(22) Filed: Nov. 7, 2017

(65) Prior Publication Data
US 2018/0132020 A1 May 10, 2018

(30) Foreign Application Priority Data
Nov. 10, 2016 (KR) .................. 10-2016-0149441

(51) Int. Cl.
*H04R 1/02* (2006.01)
*H05K 5/00* (2006.01)
*H05K 5/03* (2006.01)

(52) U.S. Cl.
CPC ............. *H04R 1/023* (2013.01); *H04R 1/028* (2013.01); *H05K 5/0017* (2013.01); *H05K 5/03* (2013.01); *H04R 2499/11* (2013.01)

(58) Field of Classification Search
CPC ........ H04R 1/026; H04R 1/023; H04R 1/025; H04R 1/086; H04R 2201/028; H04R 1/2811; H04R 1/345; H05K 5/0017; H05K 5/03; H05K 5/0217; H05K 5/06; H05K 5/069
See application file for complete search history.

(56) References Cited

U.S. PATENT DOCUMENTS

| 2013/0094686 | A1* | 4/2013 | Shin ..................... G06F 1/1688 381/333 |
| 2014/0079231 | A1* | 3/2014 | Yu ....................... H04M 1/0281 381/59 |
| 2014/0233170 | A1* | 8/2014 | Hobson ................. H01Q 1/243 361/679.3 |
| 2015/0212552 | A1* | 7/2015 | Shin ..................... G06F 1/1675 361/679.26 |

(Continued)

FOREIGN PATENT DOCUMENTS

KR   10-2014-0014638   2/2014

*Primary Examiner* — Mohammad Islam
(74) *Attorney, Agent, or Firm* — Nixon & Vanderhye P.C.

(57) ABSTRACT

Disclosed is an electronic device including a side speaker hole. The disclosed electronic device may include: a housing including a first face facing a first direction, a second face facing a second direction opposite the first direction, a side face facing a third direction perpendicular to each of the first and second directions and surrounding at least a portion of a space between the first and second faces; a first plate disposed on the first face and exposed in the first direction; and a second plate disposed on the second face and exposed in the second direction. The first plate may include a plurality of first edge regions, and at least one of the first edge regions includes, in at least a portion thereof, at least one first curved region that extends in the third direction, and at least one speaker hole may be disposed on a side face between the first curved region and the second plate.

19 Claims, 43 Drawing Sheets

(56) References Cited

U.S. PATENT DOCUMENTS

| | | | |
|---|---|---|---|
| 2015/0219608 A1* | 8/2015 | Choi | G01N 33/0004 73/23.2 |
| 2015/0281410 A1* | 10/2015 | Takahashi | H04M 1/026 455/575.1 |
| 2015/0340795 A1* | 11/2015 | Lee | G06F 1/1656 381/334 |
| 2017/0373431 A1* | 12/2017 | Lee | H01R 13/5205 |

* cited by examiner

ELECTRONIC DEVICE WITH SIDE SPEAKER HOLE

CROSS-REFERENCE TO RELATED APPLICATION

This application is based on and claims priority under 35 U.S.C. § 119 to Korean Patent Application Serial No. 10-2016-0149441, which was filed in the Korean Intellectual Property Office on Nov. 10, 2016, the content of which is incorporated by reference herein in its entirety.

TECHNICAL FIELD

The present disclosure relates generally to an electronic device including a side speaker hole.

BACKGROUND

In general, a portable electronic device may have a plurality of sound components, which are arranged in a housing. For example, at least one microphone and at least one speaker may be arranged as sound components.

A speaker may be arranged on a portion of a front face, a rear face, or a side face of the housing, and one or more speakers may be disposed. The speaker may be provided with at least one speaker hole in the housing in order to transmit the emitted sound to the outside. At least one speaker hole may be formed on the front face, the side face, or the rear face of the housing.

In addition, at least one speaker hole provided in the housing may have a structure configured to prevent and/or reduce the infiltration of foreign matter.

In the case where a curved surface display region having a curvature is formed in an edge region located on a side of a display disposed on the front face of the electronic device or in the case where a curved face region having a curvature is formed in an edge region located on a side of a cover disposed on the rear face, there is a problem in that it is impossible to arrange a speaker hole in the side face of the housing since the side face of the housing is narrow, but the speaker hole should be disposed in a side face on the upper portion or the lower portion of the housing.

SUMMARY

The present disclosure may provide an electronic device in which a speaker hole is capable of being arranged in a side face even if an edge region located in any one of upper, lower and side edges of the housing is formed in a curved shape.

Various example embodiments of the present disclosure may provide an electronic device including a side speaker hole that is capable of ensuring antenna performance due to structural simplification thereof.

Various example embodiments of the present disclosure may provide an electronic device including a side speaker hole that is improved in simplification of assembly.

Various example embodiments of the present disclosure may provide an electronic device having a side speaker hole having a double foreign matter infiltration prevention and/or reduction structure.

Various example embodiments of the present disclosure may provide an electronic device including a sound leakage prevention and/or reduction structure in a foreign matter infiltration prevention and/or reduction structure, and including a side speaker hole capable of preventing and/or reducing deterioration in sound quality due to the foreign matter infiltration prevention and/or reduction structure.

An electronic device according to various example embodiments of the present disclosure may include: a housing including a first face facing a first direction, a second face facing a second direction opposite the first direction, a side face facing a third direction perpendicular to each of the first and second directions and surrounding at least a portion of a space between the first and second faces; a first plate disposed on the first face and exposed in the first direction; and a second plate disposed on the second face and exposed in the second direction. The first plate may include a plurality of first edge regions, and at least one of the first edge regions includes, in at least a portion thereof, at least one first curved region that extends in the third direction, and at least one speaker hole may be disposed on a side face between the first curved region and the second plate.

An electronic device according to various example embodiments of the present disclosure may include: a housing including a first face facing a first direction, a second face facing a second direction opposite the first direction, a side face facing a third direction perpendicular to each of the first and second directions and surrounding at least a portion of a space between the first and second faces; a display device disposed on the first face and exposed in the first direction; a cover disposed on the second face and exposed in the second direction; a case disposed between the first and second faces and supporting the display device exposed in the first direction; and a printed circuit board disposed to face the second direction, the printed circuitry board having a speaker mounted on thereon and supported by the case. The cover may include a flat portion, and at least one edge region surrounding the flat portion. The at least one edge region may include, in at least a portion thereof, a first curved region, and at least one speaker hole may be disposed on a side face between the first curved region and the first face.

According to various example embodiments of the present disclosure, the electronic device may have at least one speaker hole on a side face that is located on a lateral side of the housing.

According to various example embodiments of the present disclosure, an electronic device may ensure antenna performance due to structural simplification.

According to various example embodiments of the present disclosure, the electronic device may be improved by simplifying assembly due to the structural simplification.

According to various example embodiments of the present disclosure, an electronic device may be applied with a double foreign matter infiltration prevention and/or reduction structure, thereby improving sound quality.

According to various example embodiments of the present disclosure, an electronic device may be provided with a sound leakage prevention and/or reduction structure in a foreign matter infiltration prevention and/or reduction structure, thereby improving sound quality.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein:

FIGS. 12A, 12B, 12C and 12D are diagrams illustrating an example mounting body according to various example embodiments of the present disclosure, in which FIG. 12A is a perspective view illustrating the mounting body in the state of being viewed downward from an upper side, FIG. 12B is a perspective view illustrating the mounting body in the state of being viewed upward from a lower side, FIG. 12C is a front view of the mounting body, and FIG. 12D is a side view of the mounting body;

FIGS. 13A and 13B are diagrams illustrating an example mesh unit attached to the mounting body according to various example embodiments of the present disclosure, in which FIG. 13A is a perspective view of the mesh unit and FIG. 13B is a side view of the mesh unit;

FIGS. 14A and 14B are diagrams each illustrating a mounting body to which an example mesh unit is attached, according to various example embodiments of the present disclosure, in which FIG. 14A is a perspective view of the mounting body to which the mesh unit is attached and FIG. 14B is a front view of the mounting body to which the mesh unit is attached;

FIGS. 17A, 17B and 17C are views illustrating an example mounting body of an example foreign-matter infiltration prevention and/or reduction device according to various example embodiments of the present disclosure, in which FIGS. 17A and 17B are perspective views each illustrating the mounting body and FIG. 17C is a side view of the mounting body;

FIGS. 20A and 20B are diagrams each illustrating an example mounting body employed in yet another example foreign-matter infiltration prevention and/or reduction device according to various example embodiments of the present disclosure, in which FIG. 20A is a perspective view of the mounting body and FIG. 20B is a front view of the mounting body.

DETAILED DESCRIPTION

Figure 1A:
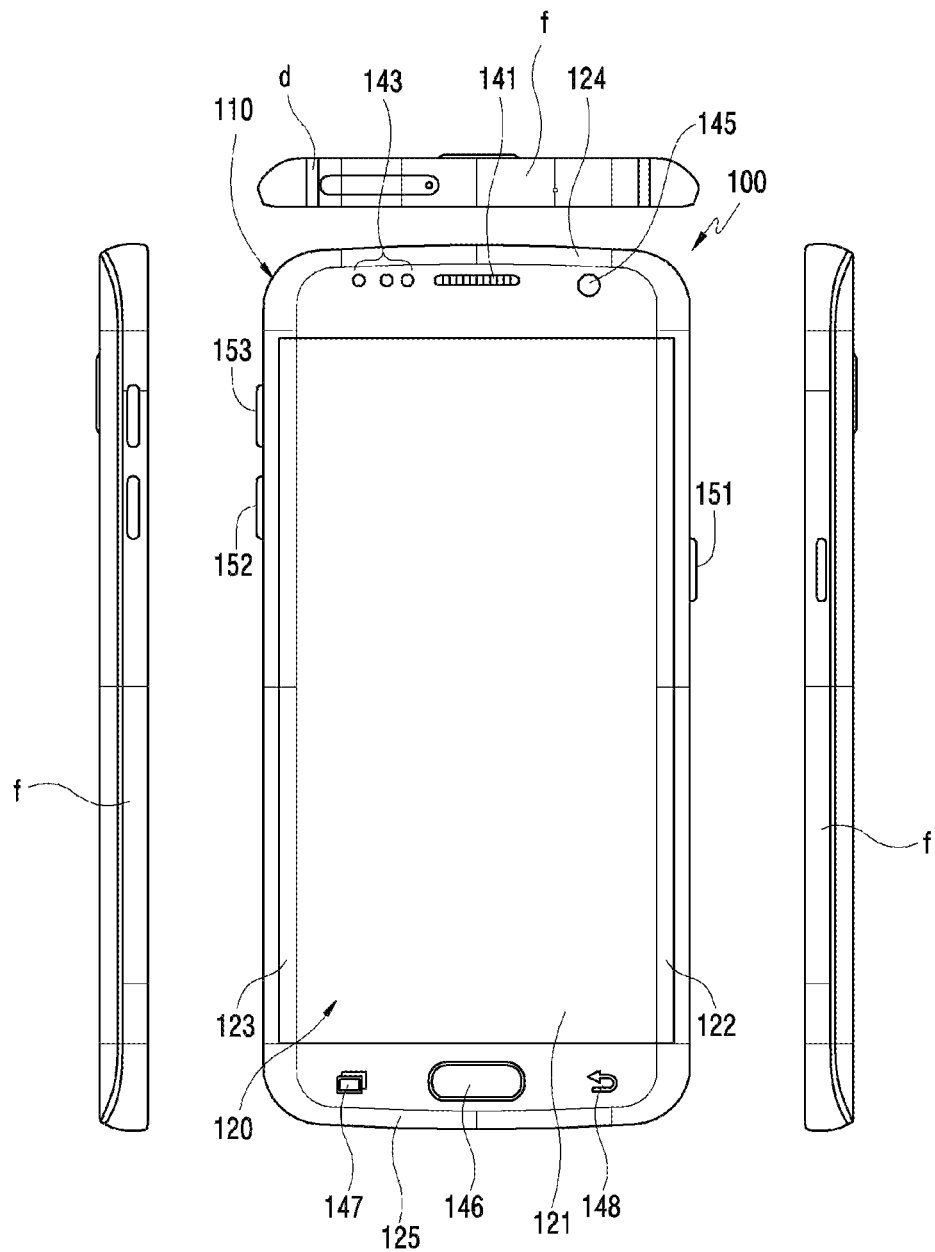
FIG. 1A is a diagram illustrating a front view, left and right side views, and a plan view of an electronic device according to a conventional example.

Hereinafter, various example embodiments of the present disclosure will be described with reference to the accompanying drawings. However, it should be understood that there is no intent to limit the present disclosure to the particular forms disclosed herein; rather, the present disclosure should be understood to cover various modifications, equivalents, and/or alternatives of embodiments of the present disclosure. In describing the drawings, similar reference numerals may be used to designate similar constituent elements.

For example, the electronic device may include at least one of a smartphone, a tablet Personal Computer (PC), a mobile phone, a video phone, an electronic book (e-book) reader, a desktop PC, a laptop PC, a netbook computer, a Personal Digital Assistant (PDA), a Portable Multimedia Player (PMP), an MP3 player, a mobile medical appliance, a camera, and a wearable device (e.g., a Head-Mounted-Device (HMD) such as electronic glasses, electronic clothes, an electronic bracelet, an electronic necklace, an electronic appcessory, electronic tattoos, or a smart watch), or the like, but is not limited thereto.

Figure 1B:
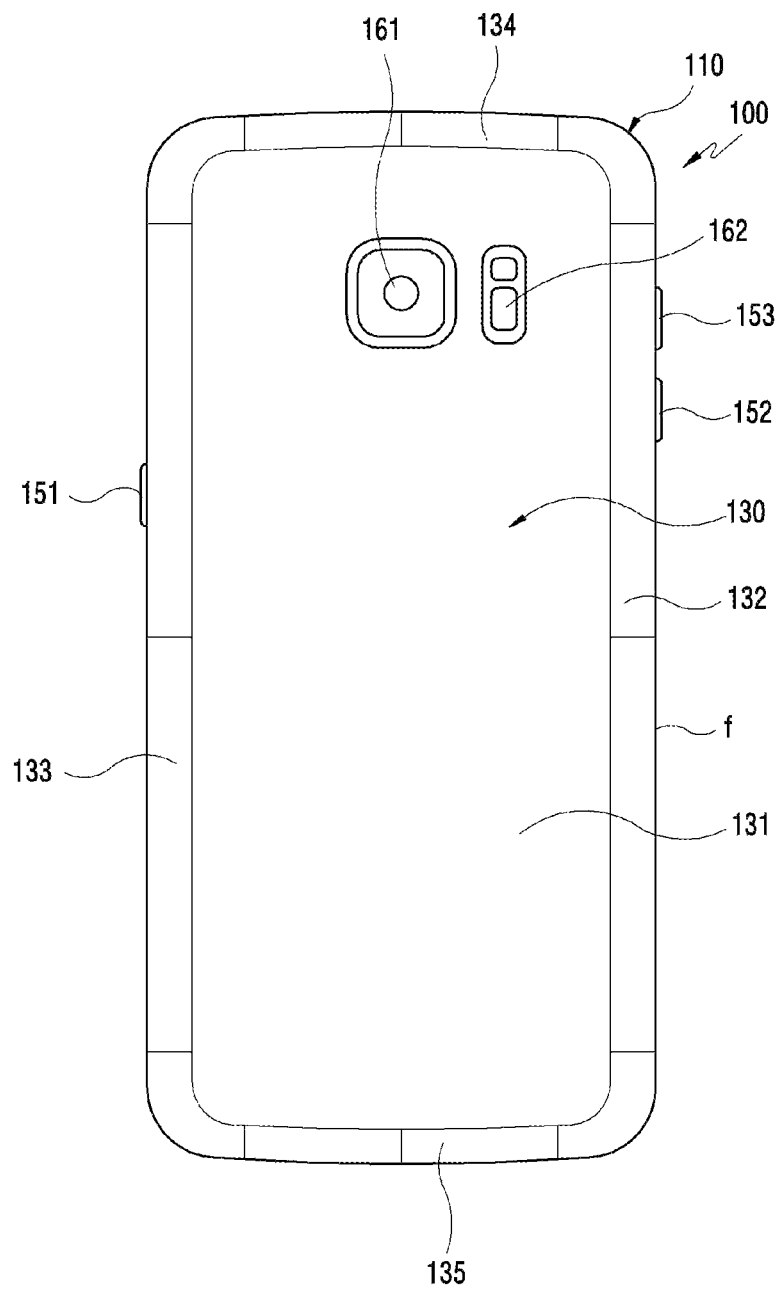
FIG. 1B is a diagram illustrating a rear view of the electronic device according to the conventional example.
Figure 1C:
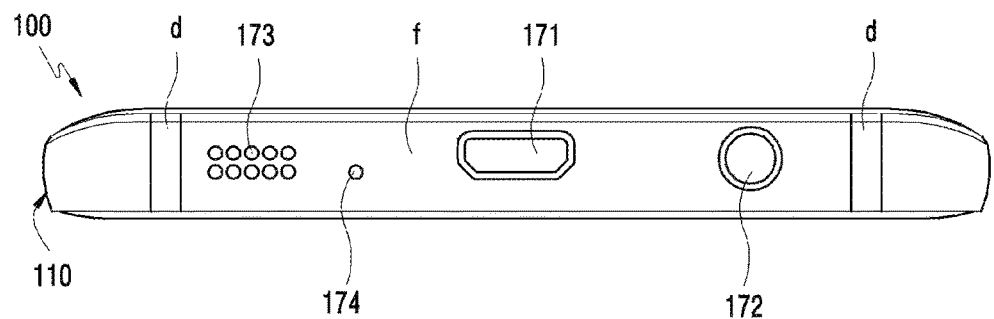
FIG. 1C is a diagram illustrating a bottom view of the electronic device according to the conventional example.

FIG. 1A is a diagram illustrating a front view, left and right side views, and a plan view of an electronic device according to a conventional example. FIG. 1B is a diagram illustrating a rear view of the electronic device according to the conventional example. FIG. 1C is a diagram illustrating a bottom view of the electronic device according to the conventional example.

Referring to FIGS. 1A to 1C, an electronic device 100 according to various embodiments may include a housing 110, and a display device 120 (which may also be referred to as a "touch screen") may be provided on the front face of the housing 110. According to various embodiments, the housing 110 may have a receiver 141 disposed above the display device 120 and a home key 146 disposed below the display device 120.

According to various embodiments, components for conducting various functions of the electronic device 100 may be arranged around the receiver 141 in the electronic device 100. The components may include at least one sensor module 143. The sensor module 143 may include at least one of, for example, an illuminance sensor (e.g., an optical sensor), a proximity sensor (e.g., an optical sensor), an infrared sensor, and an ultrasonic sensor. According to one embodiment, the components may include a front camera 145.

According to various embodiments, the display device 120 may be formed as a large screen to occupy a greater portion of the front face of the electronic device 100. For example, the display device 120 of the electronic device may be configured as a flat display region 121, a curved display region having a curvature, or a face in which a flat display region and a curved display region are combined. A plurality of first edge regions 122-125 may be disposed along the periphery of the flat display region 121.

According to various embodiments, the display device 120 may include a flat display region 121 and a curved display region. The curved display region may be disposed at an edge of the flat display region. Curved display regions may be disposed on the opposite side edge regions 122 and 123 of the flat display region, respectively. In addition, each of the upper and lower edge regions 124 and 125 of the flat display region 121 needs not be limited to a flat region, and may be configured as a curved region.

A main home screen may be a first screen that is displayed on the display device 120 when the power source of the electronic device 100 is turned on. In addition, when the electronic device 100 has several pages of different home screens, the main home screen may be the first home screen among the several pages of home screens. The home screen may display shortcut icons to execute frequently used applications, a main menu switching key, the time, the weather, or the like. The main menu switching key may cause the main screen to be displayed on the display device 120. In addition, in the upper end of the display device 120, status bars may be formed to indicate the statuses of the electronic device 100, such as a battery charge status, a received signal strength, and the current time. Below the display device 120, a home key 146, a menu key 147, a back key 148, and the like may be formed.

According to various embodiments, the home key 146 may cause the main home screen to be displayed on the display device 120. For example, when the home key 146 is touched in the state where a home screen, which is different from the main home screen, or the menu screen is displayed on the display device 120, the main home screen may be displayed on the display device 120. In addition, when the home key 146 is touched during the execution of applications on the display device 120, the main home screen may be displayed on the display device 120. In addition, the home key 146 may also be used in order to cause the most recently used application or a task manager to be displayed on the display device 120. The home key 146 may be eliminated from the front portion of the electronic device 100. A fingerprint recognition sensor device may be disposed on the top face of the home key 146. For example, the home key 146 may be configured to perform a first function (e.g., the home screen return function or a wake-up/sleep function) by an operation of physically pressing the home key button, and to perform a second function (e.g., a fingerprint recognition function) by an operation of swiping the top face of the home key.

According to various embodiments, the menu key 147 may provide a connection menu that may be used on the display device 120. For example, the connection menu may include, for example, a widget addition menu, a background screen change menu, a retrieve menu, an edition menu, and an environment setting menu. According to various embodiments, the back key 148 may cause the screen, which was executed just prior to the currently executed screen, to be displayed, or may cause the most recently used application to be terminated.

According to various embodiments, the electronic device 100 may include a metal frame f as the housing 110 made of a metal. The metal frame f may be arranged along the rim of the electronic device 100, and may be disposed to extend to at least a partial region of the rear face of the electronic device 100 that extends from the rim. The metal frame f may be at least a portion of the thickness of the electronic device 100 along the rim of the electronic device 100, and may be formed in a split structure.

According to various embodiments, the metal frame f may be disposed in only a partial region of the rim of the electronic device 100. When the metal frame f is a portion of the housing 110 of the electronic device 100, the remaining portion of the housing 110 may be replaced by a non-metallic member. In such a case, the housing 110 may be formed in a manner in which the non-metallic member is molded on the metal frame f through insert injection molding. The metal frame f includes one or more split portions d so that a unit metal frame separated by the split portions d may be utilized as an antenna radiator. An upper frame may be a unit frame defined by a pair of split portions (not illustrated) formed at a predetermined interval. A lower frame f (FIG. 1C) may serve as a unit frame defined by a pair of split portions d formed at a predetermined interval. The split portions d may be formed in unison when the non-metallic member is molded on a metal member through insert injection molding.

According to various embodiments, various electronic components may be disposed on the metal frame f Speaker holes 173 may be disposed at one side of a microphone hole 174. At the other side of the microphone hole 174, an interface connector 171 may be disposed such that a function of exchanging data with an external device may be performed and such that external power may be applied thereto in order to charge the electronic device. An ear jack hole 172 may be disposed at one side of the interface connector 171. All of the above-mentioned microphone hole 174, speaker holes 173, interface connector 171, and ear jack hole 172 may be disposed within the region of the unit frame that is formed by a pair of split portions d disposed in the metal frame f Without being limited thereto, however, at least one of the above-mentioned electronic components may be disposed within a region that includes the split portions d, or may be disposed outside the unit frame.

According to various embodiments, one or more side key buttons 152 and 153 may be disposed on the metal frame f. A pair of side key buttons 152 and 153 may be disposed to protrude from the left frame f so as to perform a volume up/down function, a scroll function, or the like. According to various embodiments, one or more other side key buttons 151 may be disposed on the right metal frame f. The other side key buttons 151 may perform a power ON/OFF function, a wake-up/sleep function of the electronic device, or the like.

According to one embodiment, a rear camera 161 may be disposed on the rear face (rear cover) of the electronic device 100, and one or more electronic components 162 may be disposed at one side of the rear camera 161. For example, the electronic components may include at least one of an illuminance sensor (e.g., an optical sensor), a proximity sensor (e.g., an optical sensor), an infrared sensor, an ultrasonic sensor, a heart rate sensor, and a flash device.

The rear face of the electronic device 100 according to various embodiments may include a flat portion 131 and edge regions 132-135 disposed along the periphery of the flat portion 131. The edge regions may include an upper edge region 134, a lower edge region 135, and lateral edge regions 132 and 133. Each of the edge regions 132-135 may be provided as a curved face to improve the grip feeling of the electronic device 100, and may include a curved region having a curvature.

The housing 110 of the electronic device according to the above-described configuration may have speaker holes formed in the upper end frame, the lower end frame, or in the upper or lower ends of the side frames. The arrangement regions of the side frames of the housing 110 is narrower than that of the upper end frame or the lower end frame due to the curved regions, and as a result, it may difficult to form speaker holes in the side frames. For this reason, the speaker may be disposed in the lower end of the housing, and at least one speaker hole 173 may be formed in the lower end frame f.

Figure 2:
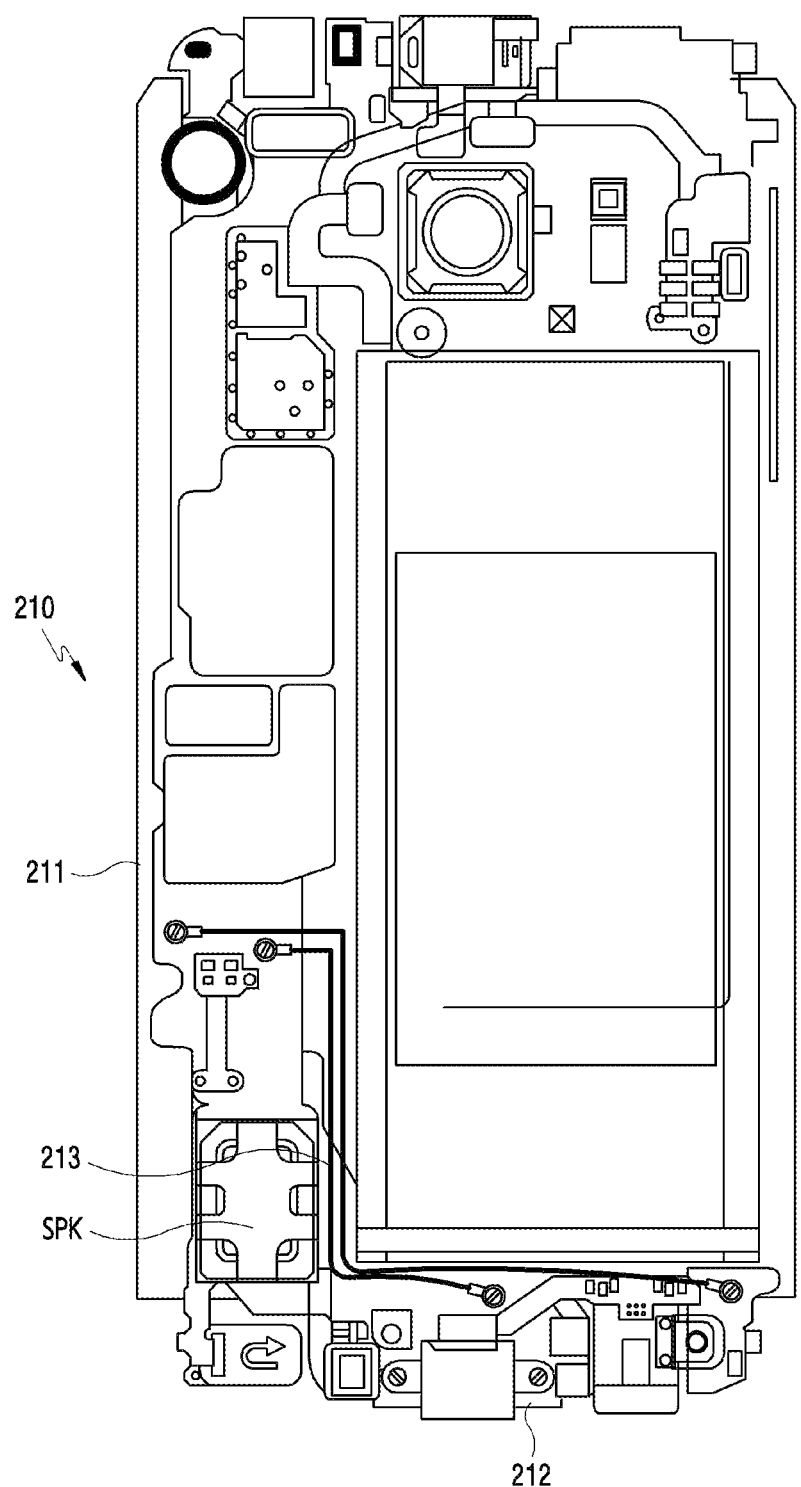
FIG. 2 is a diagram illustrating a printed circuit board accommodated in the housing of the electronic device according to the conventional example.

FIG. 2 is a diagram illustrating a printed circuit board accommodated in the housing of the electronic device according to the conventional example.

As illustrated in FIG. 2, in the electronic device according to the conventional example, a printed circuit board 210 should be separated into a main printed circuit board 211 and an auxiliary printed circuit board 212 by a speaker spk disposed at the lower end of the housing, and according to the separated structure of the printed circuit board 210, a structural problem occurs in that the main printed circuit board 211 and the auxiliary printed circuit board 212 should be electrically connected to each other using an RF cable 213. Such a structural problem may cause problems such as deterioration in ease of assembly, increase in material costs, and the like.

At least one antenna radiator is formed on the auxiliary printed circuit board 212. The structural problem of implementing the electrical connection using such an RF cable may adversely affect the performance of the antenna radiator provided on the auxiliary printed circuit board 212.

Hereinafter, the configuration of an electronic device according to various example embodiments of the present disclosure will be described with reference to the accompanying drawings.

Figure 3A:
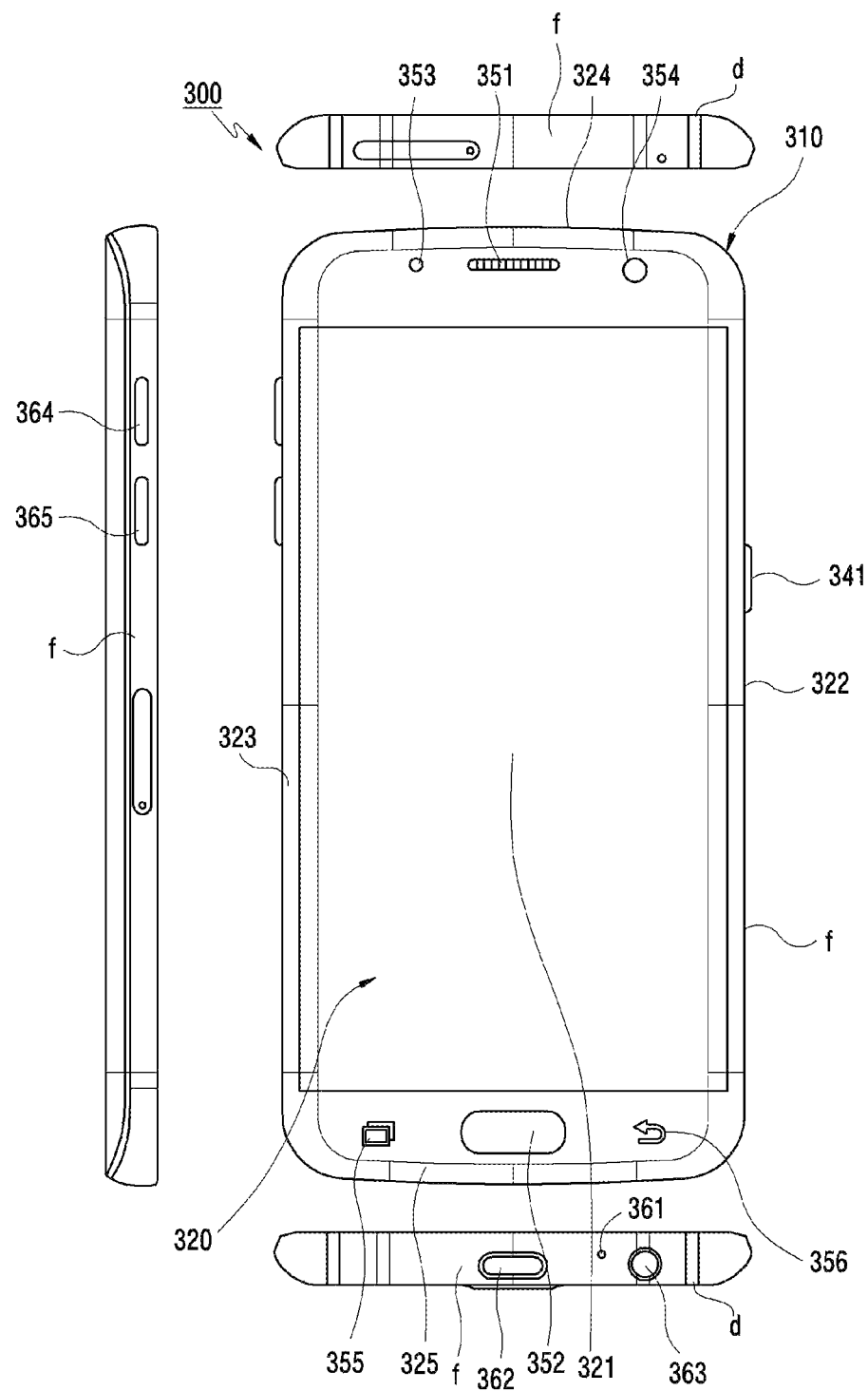
FIG. 3A is a diagram illustrating examples of a front view, a left side view, a plan view, and a bottom view of an electronic device according to various example embodiments of the present disclosure.
Figure 3B:
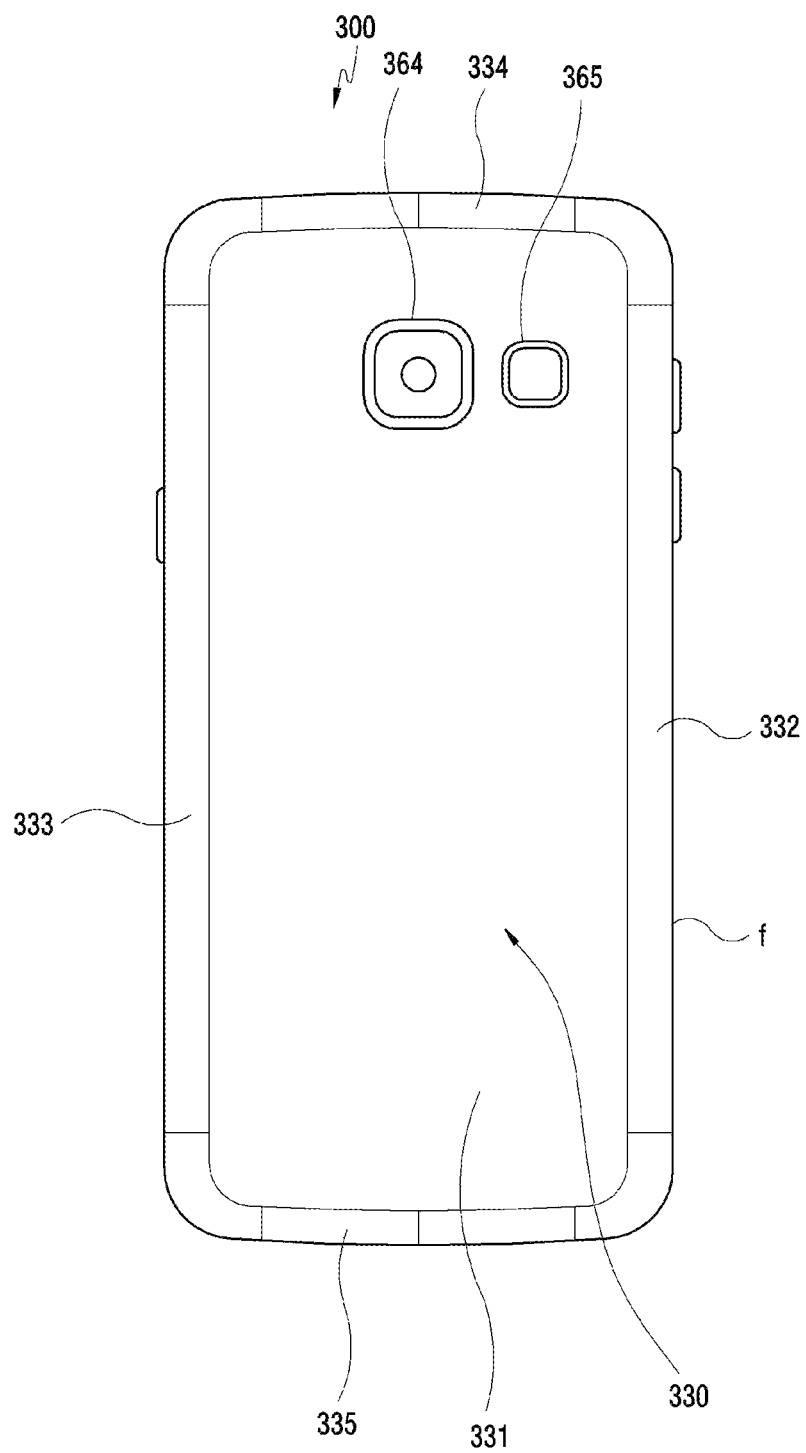
FIG. 3B is a diagram illustrating an example rear view of the electronic device according to various example embodiments of the present disclosure.
Figure 3C:
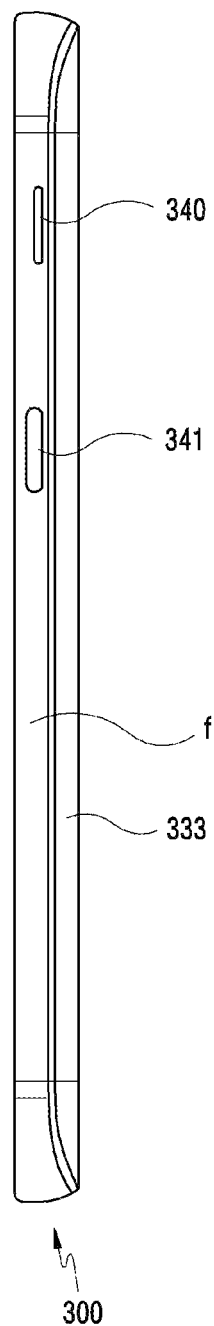
FIG. 3C is a diagram illustrating an example right side view of the electronic device according to various example embodiments of the present disclosure.
Figure 3D:
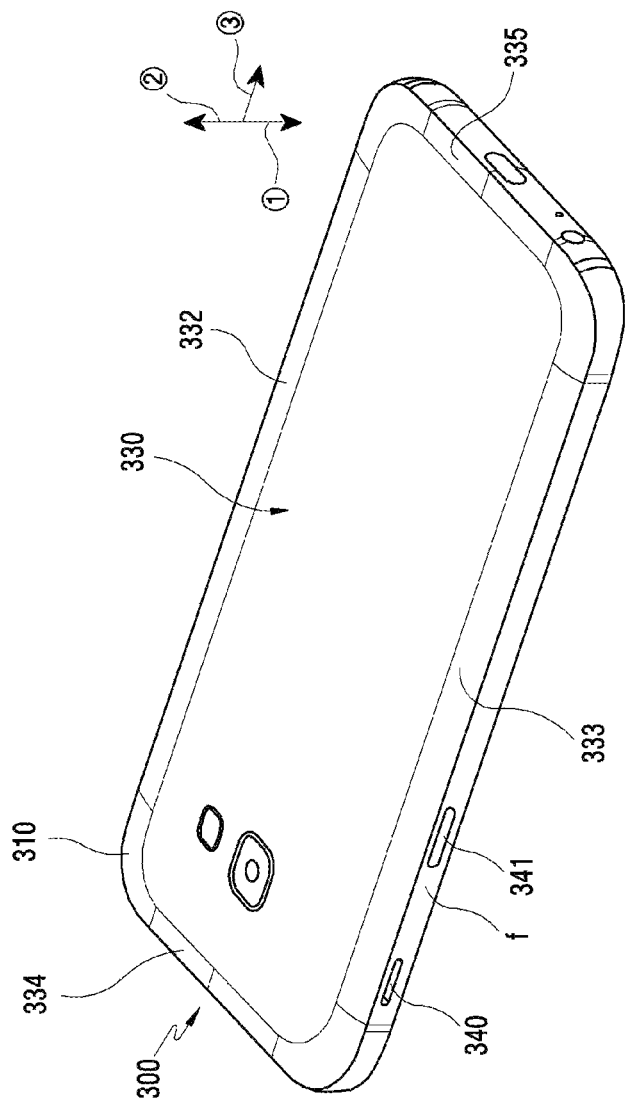
FIG. 3D is a diagram illustrating a perspective view of the rear face of the electronic device according to various example embodiments of the present disclosure.
Figure 3E:
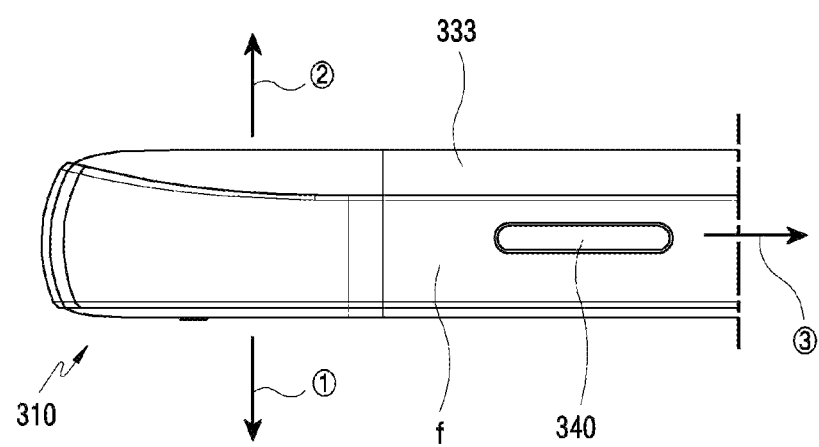
FIG. 3E is a diagram illustrating an example speaker hole provided in the electronic device according to various example embodiments of the present disclosure in an enlarged scale.

FIG. 3A is a diagram illustrating examples of a front view, a left side views, a plan view, and a bottom view of an electronic device according to various example embodiments of the present disclosure. FIG. 3B is a diagram illustrating a rear view of the electronic device according to various example embodiments of the present disclosure. FIG. 3C is a diagram illustrating a right side view of the electronic device according to various example embodiments of the present disclosure. FIG. 3D is a diagram illustrating a perspective view illustrating the rear face of the electronic device according to various example embodiments of the present disclosure. FIG. 3E is a diagram illustrating a speaker hole provided in the electronic device according to various example embodiments of the present disclosure in an enlarged scale.

Referring to FIGS. 3A to 3D, according to various embodiments, the electronic device 100 may include a housing 310, which protects various electronic components and forms the external appearance thereof. According to various embodiments, the housing 310 may include a first face facing a first direction, a second face facing a second direction opposite the first direction, and a side face facing a third direction that is perpendicular to each of the first and second directions and surrounds at least a portion of the space between the first and second faces. When the first direction is upward, the first face may be a top face, when the second direction is downward, the second face may be a bottom face, and when the third direction is a lateral direction, and the third face may be a side surface.

According to various embodiments, the housing 310 may include a first plate 321 facing the first direction in the first face and a second plate 331 facing the second direction in the second face. At least a portion of the first plate 321 may be exposed to the first face and at least a portion of the second plate 331 may be exposed to the second face. The first plate 321 may include a transparent substrate disposed on the front face of the electronic device 300. The transparent substrate may include, for example, a transparent window or a display device including a transparent window. The second plate 331 may include a transparent substrate or an opaque substrate disposed on the rear face of the electronic device 300. The transparent substrate may include a glass material or a transparent resin material, and the opaque substrate may include an opaque resin material, a metal material, or the like. At least a part of the third face may be made of a synthetic resin material or may include a metal material. For example, the second plate 331 may include any one of a rear cover and a battery cover of the electronic device 300. The second plate 331 may be integrally formed in the electronic device, or may be detachably configured.

The first plate 321 according to various embodiments may include a plurality of first edge regions 322-325. The plurality of first edge regions may include a first upper edge region 324, a first lower edge region 325, and first opposite side edge regions 322 and 323. The first edge regions 322-325 may be disposed adjacent to the third face, i.e., the side member, and each of the first edge regions 322-325 may extend along the third face. The direction of extension may be a widthwise direction or a longitudinal direction of the electronic device 300.

Among the first edge regions 322-325 according to various embodiments, at least one edge region may include a first curved edge region. The first curved edge region may be formed in any one of the first upper edge region 324, the first lower edge region 325, and the first opposite side edge regions 322 and 323. For example, the first curved edge region may be configured to have a curvature, and will be described in greater detail below with reference to FIG. 7.

According to various embodiments, the second plate 331 may include a plurality of second edge regions 332-335. The plurality of second edge regions may include a second upper edge region 334, a second lower edge region 335, and second opposite side edge regions 332 and 333. The second edge regions 332-335 may be disposed adjacent to the third face, and each of the second edge regions 332-335 may extend along the third face. The direction of extension may be a widthwise direction or a longitudinal direction of the electronic device 300.

Among the second edge regions 332-335 according to various embodiments, at least one edge region may include a second curved edge region. The second curved edge region may be formed in one or more of the second upper edge region 334, the second lower edge region 335, and the second opposite side edge regions 332 and 333.

According to various embodiments, the second upper edge region 334 may be configured as a curved edge region, and the second lower edge region 335 may be configured as a curved edge region. Any one of the second opposite side edge regions 332 and 333 may be configured as a curved edge region. Each of the curved edge regions may be configured to have a curvature. Further, the respective curved edge regions may be configured to have the same curvature, or to have different curvatures. The second upper and lower edge regions 334 and 335 may be configured as curved edge regions having the same first curvature, and the second opposite side edge regions 332 and 333 may be configured to have the same second curvature. The first curvature and the second curvature may be the same as or different from each other.

According to various embodiments of the present disclosure, at least one speaker hole 340 may be formed in the third face adjacent to a second side edge region 333 configured as a curved edge region.

According to various embodiments, the housing 310 may be provided with a display device 320 (which may be referred to as a "touch screen") on the first face. According to various embodiments, the housing 310 may have a receiver 351 disposed above the display device 320 and a home key 352 disposed below the display device 320.

According to various embodiments, components for conducting various functions of the electronic device 300 may be arranged around the receiver 351 in the electronic device 300. The components may include one or more sensor modules 353. The sensor modules 353 may include at least one of, for example, an illuminance sensor (e.g., an optical sensor), a proximity sensor (e.g., an optical sensor), an infrared sensor, and an ultrasonic sensor. According to one embodiment, the electronic device includes a front camera 354 on the front face thereof.

According to various embodiments, the display device 320 may be configured as a flat display region 321, a curved display region having a curvature, or a face in which a flat display region and a curved display region (edge region) are combined.

According to various embodiments, below the display device 320, the home key 352, the menu key 355, the back key 356, and the like may be formed. The home key 352 may be eliminated from the front face portion of the electronic device 300. A fingerprint recognition sensor device may be disposed on the top face of the home key 352.

According to various embodiments, the electronic device 300 may include a metal frame f as a side member made of a metal. According to various embodiments, the metal frame f may be disposed on the third face. The metal frame f may be disposed along the side rim of the electronic device 300.

According to various embodiments, the metal frame f includes one or more split portions d so that a unit metal frame separated by the split portions d may be utilized as an antenna radiator.

According to various embodiments, various electronic components may be disposed on the metal frame f. The metal frame disposed at the lower end of the electronic device may be provided with a microphone hole 361 and an interface connector 362 disposed at one side of the microphone hole 361. An ear jack hole 363 may be disposed at one side of the interface connector 362. All of the above-mentioned microphone hole 361, an interface connector 362, and an ear jack hole 363 may be disposed within the region of the unit frame that is formed by a pair of split portions d disposed in the metal frame f.

According to various embodiments, one or more side key buttons 364 and 365 may be disposed on the metal frame f. A pair of side key buttons 364 and 365 may be disposed to protrude from the left frame f so as to perform a volume up/down function, a scroll function, or the like.

According to various embodiments, one or more speaker holes 340 and one or more other side key buttons 341 at one side of the speaker holes 340 may be disposed on the right frame f. The side key buttons 341 may perform a power ON/OFF function, a wake-up/sleep function, or the like of the electronic device 300. The speaker holes will be described in detail below.

According to an example embodiment, a rear camera 364 may be disposed on the rear face (the second plate or the rear cover) of the electronic device 300, and one or more electronic components 365 may be disposed at one side of the rear camera 364. For example, the electronic components may include at least one of an illuminance sensor (e.g., an optical sensor), a proximity sensor (e.g., an optical sensor), an infrared sensor, an ultrasonic sensor, a heart rate sensor, and a flash device.

Referring to FIG. 3E, according to various embodiments, the housing 310 may include at least one speaker hole 340, which is formed in the third face adjacent to the second edge region 333 (curved edge region) of the second plate disposed on the second face facing the second direction, that is, in the metal frame f. According to various embodiments, the speaker hole 340 may be formed as a single speaker hole. The single speaker hole may extend in the third direction in the third face.

Figure 4:
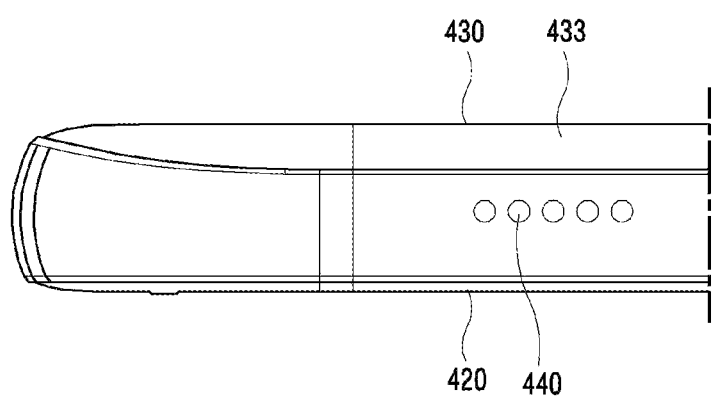
FIG. 4 is a diagram illustrating a plurality of speaker holes provided in the electronic device according to various example embodiments of the present disclosure in an enlarged scale.

FIG. 4 is a diagram illustrating an example including a plurality of speaker holes provided in the electronic device according to various example embodiments of the present disclosure in an enlarged scale.

Referring to FIG. 4, according to various embodiments, a plurality of speaker holes 440 may be formed between the second side edge region 433 (curved edge region) of the second plate 430 and the first plate 420. Respective speaker hole 440 may be aligned along the third direction on the third face. The speaker holes 440 may be configured in various shapes and numbers without being limited in terms of the shape and number thereof.

Figure 5:
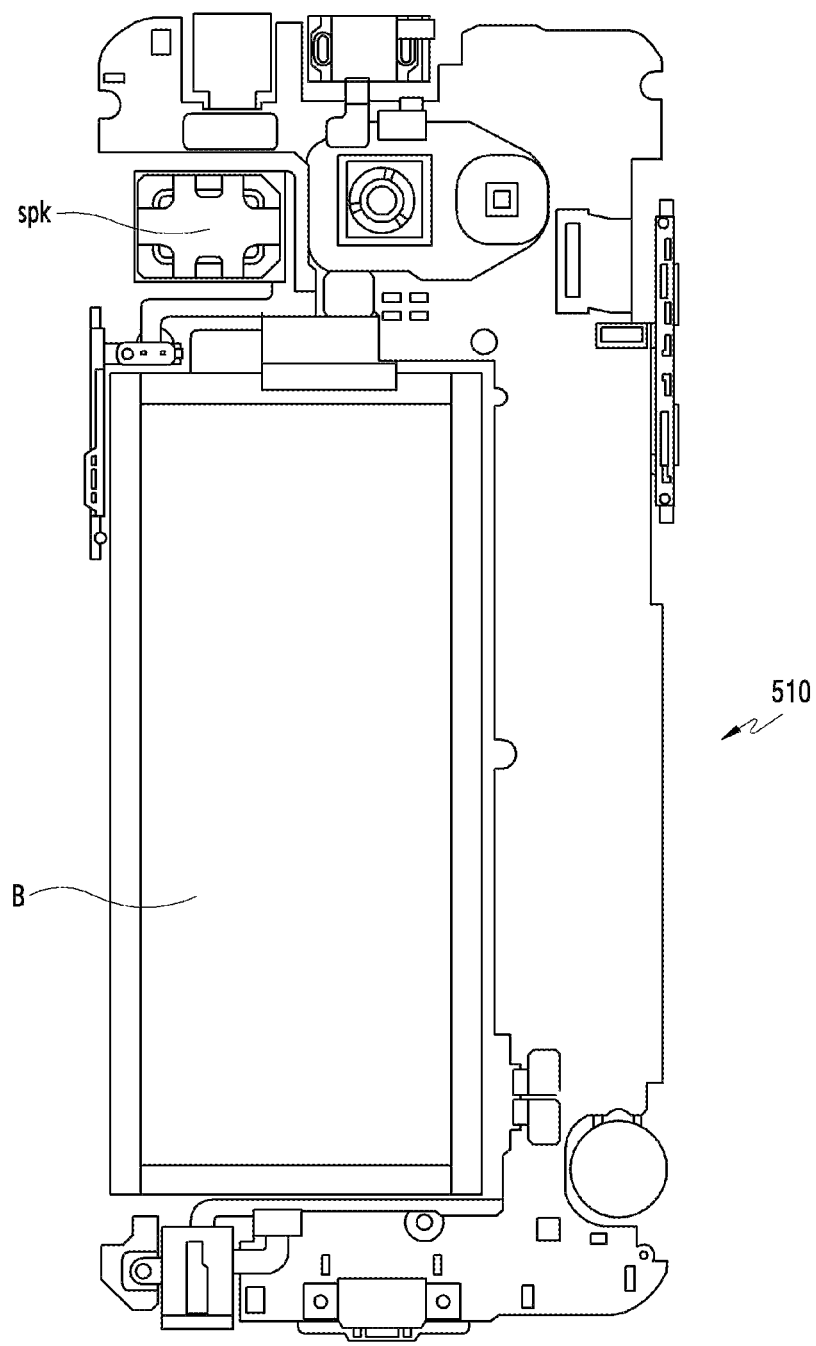
FIG. 5 is a diagram illustrating an example printed circuit board accommodated in the housing of the electronic device according to various example embodiments of the present disclosure.

FIG. 5 is a diagram illustrating an example printed circuit board accommodated in the housing of the electronic device according to various example embodiments of the present disclosure.

Referring to FIG. 5, according to various embodiments of the present disclosure, a main PCB 510 mounted in the electronic device may be configured in an integrated form. Compared with the main PCB 210 illustrated in FIG. 2, a printed circuit board may be formed as an integrated form rather than being divided into a main printed circuit board and an auxiliary printed circuit board. The speaker spk may be mounted on one side in the upper portion of the main PCB 510. The main PCB 510 may be disposed to cover at least a part of the periphery of a battery pack B without overlapping the battery pack B.

Figure 6A:
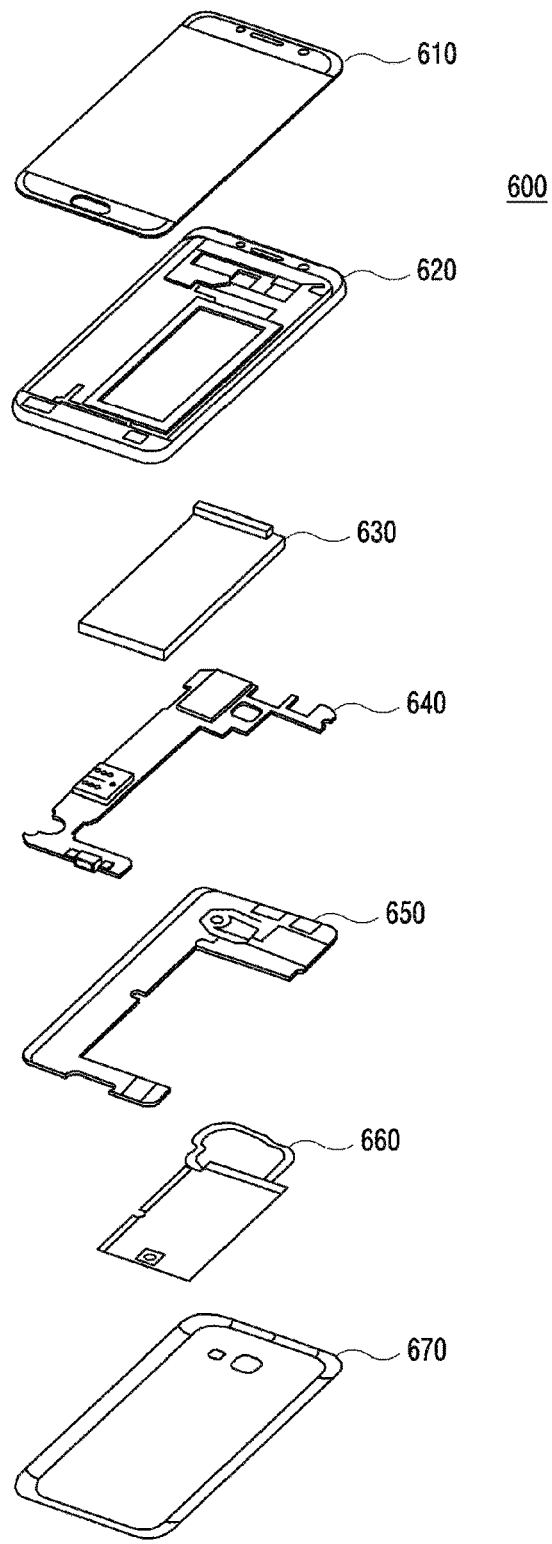
FIGS. 6A and 6B are exploded perspective views each illustrating an example internal configuration of the electronic device according to various example embodiments of the present disclosure.
Figure 6B:
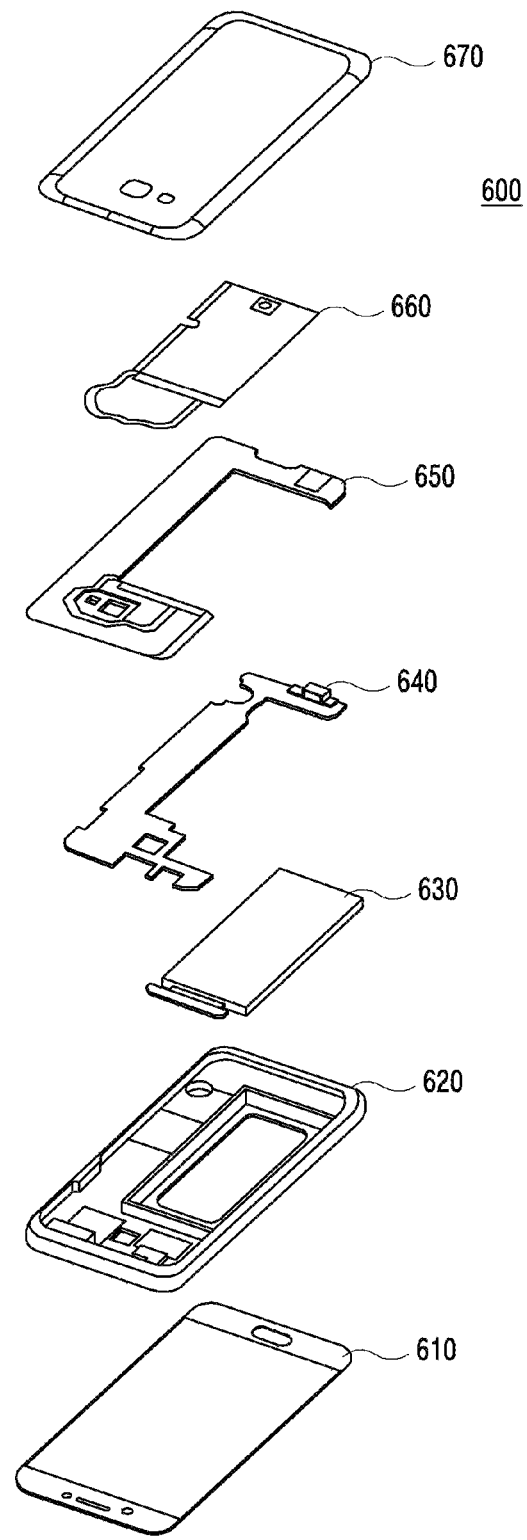

FIGS. 6A and 6B are exploded perspective views each illustrating an example internal configuration of the electronic device according to various example embodiments of the present disclosure.

Hereinafter, descriptions will be made of the internal configuration of an electronic device 600 according to various embodiments with reference to FIGS. 6A and 6B. The electronic device 600 according to various embodiments may include a display device 610, a front case 620, a battery pack 630, a main PCB 640, a rear case 650, a wireless power transmission/reception member 660, and a rear cover 670. The listed components may be assembled in the vertical direction to become a finished product of the electronic device 600. The display device 610 may be a first plate, and the rear cover 670 may be a second plate.

According to various embodiments, the display device 610 may include a transparent window and an OLED, but is not limited thereto. According to various embodiments, the display device 610 may include a planar window and a flat display, a curved window and a flat display, or a curved window and a curved (flexible) display. The term "curved" may indicate, for example, that a surface is a curved surface, and may have a curvature. In addition, according to various embodiments, the display device 610 may include a curved portion that may be provided in a flat portion and in at least one edge portion provided on the flat portion.

According to various embodiments, the front case 620 may be a support structure that supports the display device 610 and the main PCB 640 in combination with the rear case 650. According to various embodiments, the battery pack 630 is accommodated in an accommodation space formed in the front case 620, and may be disposed to avoid the main PCB 640. According to an example embodiment, the battery pack 630 and the main PCB 640 may be disposed parallel to each other without overlapping each other.

According to various embodiments, the support structure including the front case 620 and the rear case 650 may be disposed within the electronic device 600, and may be used as a component for increasing the overall rigidity of the electronic device 600. For example, at least one of Al, Mg, and STS may be used for an inner support structure.

According to an example embodiment, for the inner support structure, a high-rigidity plastic containing glass fiber may be used, or a metal and a plastic may be used together. For example, when a metal material and a non-metal material are used together as the material for the inner support structure, the inner support structure may be formed in the manner of molding the non-metal material on the metal material through insert injection molding.

According to various embodiments, the battery pack 630 may supply power to the electronic device 600. One face of the battery pack 630 may be disposed adjacent to the display module 610, and the other face of the battery pack 630 may be disposed adjacent to the rear cover 670. The battery pack 630 may be integrally disposed in the electronic device 600. However, the present disclosure is not limited thereto, and when the rear cover 670 is implemented to be detachable from the electronic device 600, the battery pack 630 may be implemented to be detachable.

According to various embodiments, the electronic device 600 may include a front window disposed on the front face thereof, and a rear window disposed on the rear face thereof. The front window or the rear window may be made of a transparent resin or a glass material. However, without being limited thereto, the rear face of the electronic device may be variously implemented using an injection-molded synthetic resin, a metal, a composite of a metal and a synthetic resin, and the like.

According to various embodiments, the wireless power transmission/reception member 660 may be disposed on the inner face of the rear cover 670. The wireless power transmission/reception member 660 is disposed in the manner of being attached to one face of an internal mounting component or to a partial region of the inner face of the housing, particularly a region generally adjacent to the rear window, in the form of a thin film, and includes a structure that forms a contact with the main PCB 640. The wireless power transmission/reception member 660 may be embedded or attached as a portion of the housing 21 or a component, such as the battery pack 630, and may be provided in the form of being simultaneously attached to both the component and the housing 210.

Figure 7A:
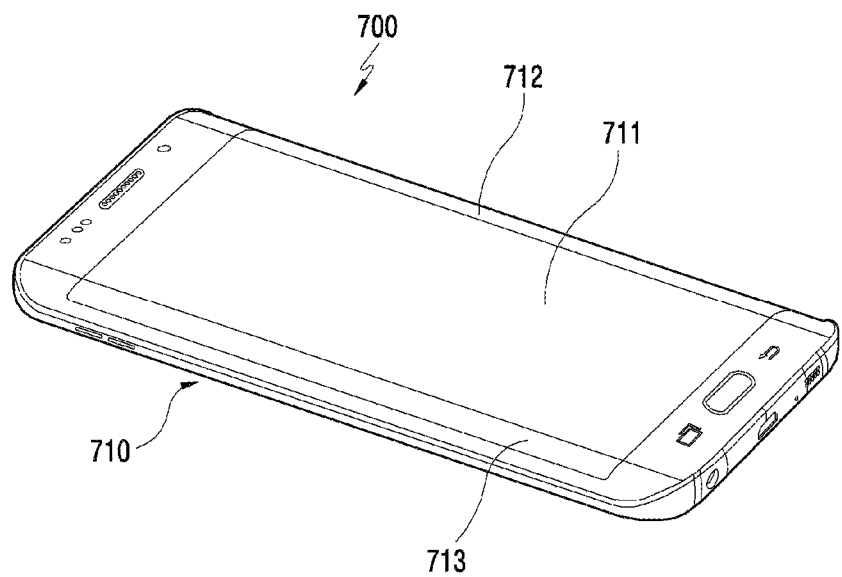
FIG. 7A is a perspective view illustrating the front face of an example electronic device according to various example embodiments of the present disclosure.
Figure 7B:
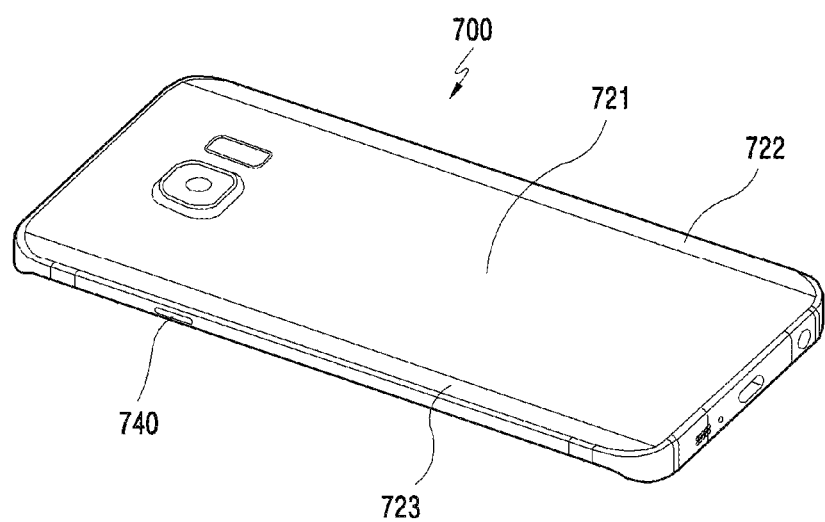
FIG. 7B is a perspective view illustrating the rear face of an example electronic device according to various example embodiments of the present disclosure.

FIG. 7A is a perspective view illustrating the front face of an example electronic device according to various example embodiments of the present disclosure. FIG. 7B is a perspective view illustrating the rear face of the example electronic device according to various example embodiments of the present disclosure.

Referring to FIGS. 7A and 7B, an electronic device 700 according to various embodiments may include a first plate 711 that is disposed to be exposed on the first face of a housing 710, and each of first and second side edge regions 712 and 713 of the first plate 711 may be configured as a curved region. For example, when the first plate 711 is a display device, each of the first and second side edge regions 712 and 713 may be a curved display region.

According to various embodiments, one or more speaker holes 740 may be formed in a side member between the first side edge region 712 and the rear cover, that is, a metal frame f located on one side face, or a side member between a second side edge region 713 and a rear cover, that is, a metal frame f located on the other side face.

According to various embodiments, in the electronic device 700, the first plate 711 may be disposed to be exposed on the second face of a housing 710, and each of first and second side edge regions 722 and 723 of the first plate 711 may be configured as a curved region.

According to various embodiments, one or more speaker holes 740 may be formed in a side member between the first side edge region 722 and the rear cover, that is, a metal frame f located on one side face, or a side member between the second side edge region 723 and the rear cover, that is, a metal frame f located on the other side face.

Figure 8:
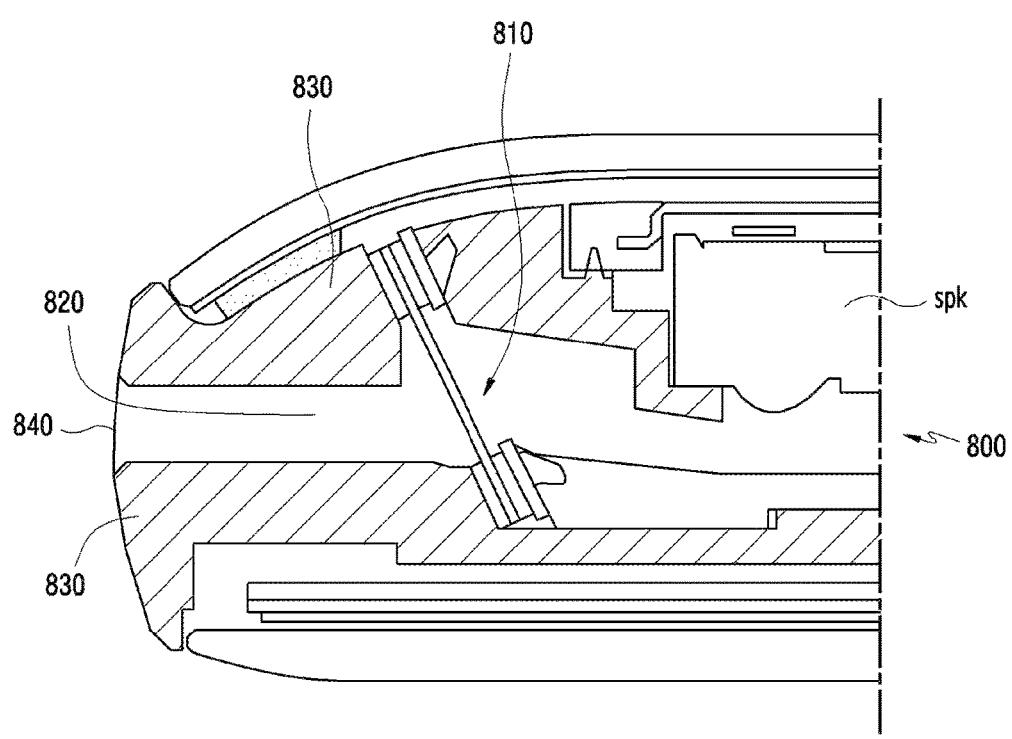
FIG. 8 is a cross-sectional view illustrating an example configuration of a foreign-matter infiltration prevention and/or reduction device mounted in a sound passage of the electronic device according to various example embodiments of the present disclosure.

FIG. 8 is a cross-sectional view illustrating an example configuration of an example foreign-matter infiltration prevention/reduction device mounted in a sound passage of the electronic device according to various example embodiments of the present disclosure.

Referring to FIG. 8, an electronic device 800 according to various embodiments may include a foreign matter blocking device 810 that is disposed in a sound passage 820 between a speaker spk mounted on a main PCB and a speaker hole 840. The sound passage 820 may be a duct-type path in which the sound emitted from the speaker spk advances to the speaker hole 840. The sound emitted from the speaker spk may be scattered to the outside of the speaker hole 840 through the sound passage 820.

According to various embodiments, a foreign-matter infiltration prevention device 810 may use a mesh-type material in order to prevent the infiltration of dust or the like that has entered from the outside (it will be understood that the term "prevention" or "prevent" or similar variants thereof may include "prevention and/or reduction" or "prevent and/or reduce", respectively. For ease of description, the terms "prevention", "prevent" or the like may be used with the understanding that these terms include "reduction", "reduce", or the like). The foreign-matter infiltration prevention device 810 may be mounted to be inclined just before the speaker spk in the sound passage 820. Due to the inclined mounting state of the foreign-matter infiltration prevention device 810, a wider mesh face is present in the sound passage, so that sound can pass through more openings in the mesh. The foreign-matter infiltration prevention device 810 is mounted in the case 830 in an inclined state, and can be mounted in a structure capable of sealing the sound passage 820.

Figure 9A:
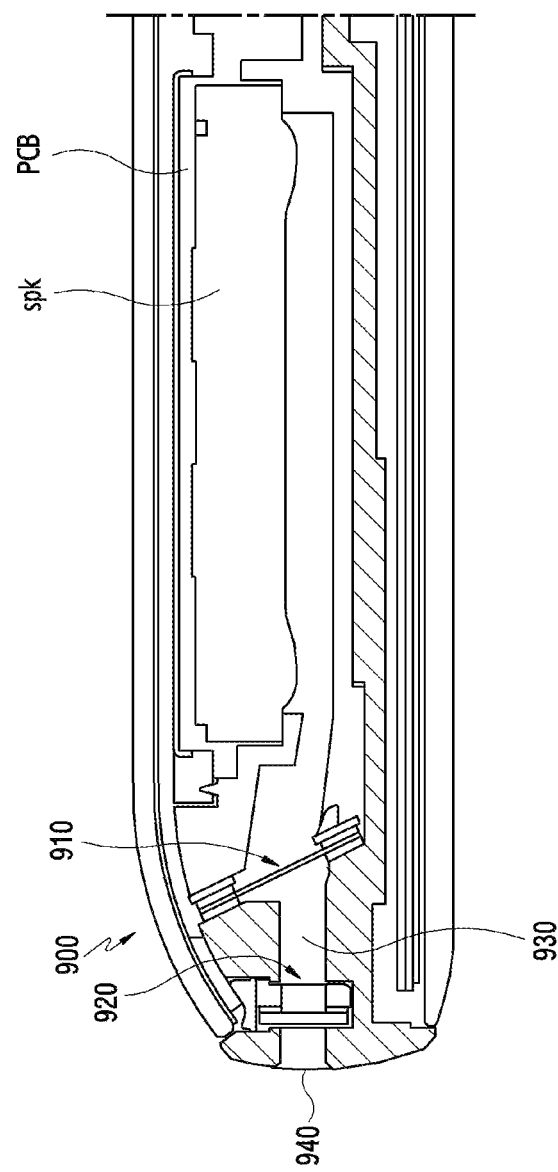
FIG. 9A is a cross-sectional view illustrating an example configuration of another foreign matter intrusion prevention and/or reduction device mounted in a sound passage of the electronic device according to various example embodiments of the present disclosure.
Figure 9B:
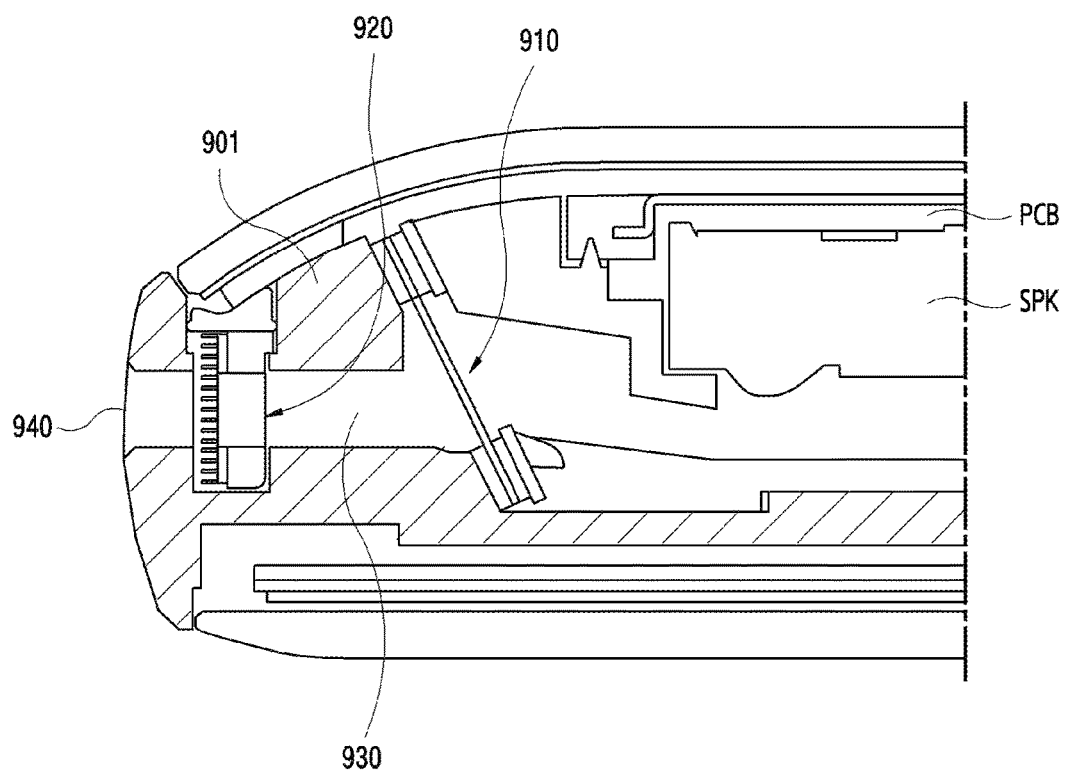
FIG. 9B is a cross-sectional diagram illustrating a main part in FIG. 9A in an enlarged scale.

FIG. 9A is a cross-sectional view illustrating an example configuration of another example foreign matter intrusion prevention device mounted in a sound passage of the electronic device according to various example embodiments of the present disclosure. FIG. 9B is a cross-sectional view illustrating a main part in FIG. 9A in an enlarged scale.

Referring to FIGS. 9A and 9B, an electronic device 900 according to various embodiments may include first and second foreign matter blocking devices 910 and 920 that may be disposed in a sound passage 930 between a speaker spk mounted on a main PCB and a speaker hole 940. The sound passage 930 may be a duct-type path in which the sound emitted from the speaker spk advances to the speaker hole 940. The sound emitted from the speaker spk may be scattered to the outside of the speaker hole 940 through the sound passage 930.

According to various embodiments, the foreign-matter infiltration prevention device may include a first foreign-matter infiltration prevention device 910 disposed adjacent to the speaker spk and disposed in an inclined state with respect to the sound passage 930, and a second foreign matter prevention device 920 disposed in the case 901 adjacent to the sound passage 940 and disposed in a direction perpendicular to the sound passage 930. The first foreign-matter infiltration prevention device 910 is a dust infiltration prevention device for preventing the infiltration of dust or the like. Although it is described by way of example that the first foreign-matter infiltration prevention device 910 is disposed to be inclined with respect to the sound passage 930, it may be oriented in the vertical direction. The second foreign-matter infiltration prevention device 920 is a device that prevents the infiltration of foreign matter larger than dust, and may be disposed approximately in the vertical direction with respect to the sound passage 930.

The first foreign-matter infiltration prevention device 910 has the same configuration as the foreign-matter infiltration prevention device 810 illustrated in FIG. 8, and thus the descriptions of the same components will not be repeated in order to avoid redundant description. The second foreign-matter infiltration prevention device 920 may be made of a mesh-type material, a metal grill, or the like, but is not limited thereto.

Hereinafter, various arrangements of the first and second foreign-matter infiltration prevention devices disposed in the sound passage of the electronic device will be described. The foreign-matter infiltration prevention device may be disposed to be inclined with respect to the sound passage, and the inclined direction will be described using an azimuth coordinate system indicating east, west, south, and north.

FIGS. 10A, 10B, 10C, 10D and 10E are cross-sectional views schematically illustrating various example arrangements of foreign-matter infiltration prevention devices mounted in a sound passage of the electronic device according to various example embodiments of the present disclosure.

The first and second foreign-matter infiltration prevention devices illustrated in FIGS. 10A to 10E may be configured to be at least partially or wholly the same as the first and second foreign-matter infiltration prevention devices illustrated in FIGS. 9A and 9B.

Figure 10A:
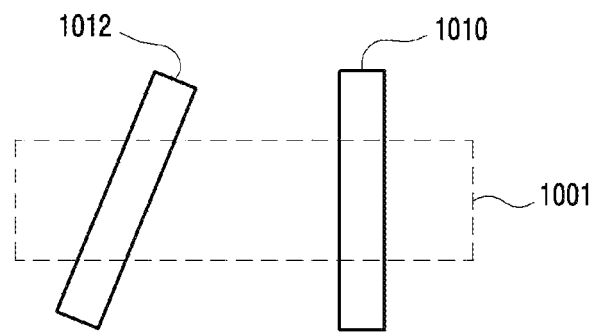
FIGS. 10A, 10B, 10C, 10D and 10E are cross-sectional views illustrating various example arrangements of foreign-matter infiltration prevention and/or reduction devices mounted in a sound passage of the electronic device according to various example embodiments of the present disclosure.

Referring to FIG. 10A, according to various embodiments, the foreign-matter infiltration prevention device may include a first foreign-matter infiltration prevention device 1010 disposed adjacent to a speaker in a sound passage 1001, and a second foreign-matter infiltration prevention device 1012 disposed adjacent to the speaker hole.

According to various embodiments, a foreign-matter infiltration prevention device may include a first foreign-matter infiltration prevention device 1010 oriented in a substantially vertical direction with respect to the sound passage 1001, and a second foreign-matter infiltration prevention device 1012 disposed to be substantially inclined in a northeast direction with respect to the sound passage 1001. The first and second foreign-matter infiltration prevention devices 1010 and 1012 may be disposed to be spaced apart from each other and to substantially face each other. Each of the first and second foreign-matter infiltration prevention devices 1010 and 1012 may be made of a mesh-type material, a metal grill-type material, or a combination thereof.

Figure 10B:
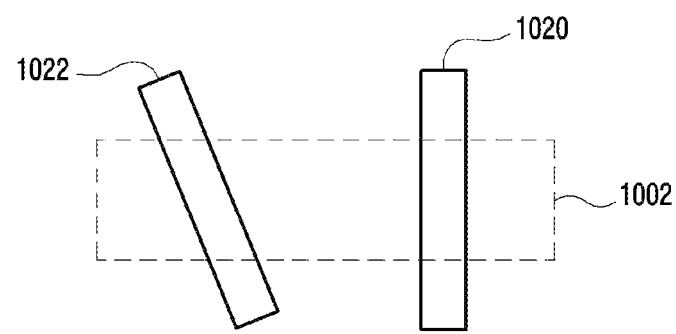

Referring to FIG. 10B, according to various embodiments, the foreign-matter infiltration prevention device may include a first foreign-matter infiltration prevention device 1020 disposed adjacent to a speaker in the sound passage 1002, and a second foreign-matter infiltration prevention device 1022 disposed adjacent to the speaker hole.

According to various embodiments, a foreign-matter infiltration prevention device may include a first foreign-matter infiltration prevention device 1020 oriented in a substantially vertical direction with respect to the sound passage 1002, and a second foreign-matter infiltration prevention device 1022 disposed to be substantially inclined in a northwest direction with respect to the sound passage 1002. The first and second foreign-matter infiltration prevention devices 1020 and 1022 may be disposed to be spaced apart from each other and to substantially face each other. Each of the first and second foreign-matter infiltration prevention devices 1010 and 1012 may be made of a mesh-type material, a metal grill-type material, or a combination thereof.

Figure 10C:
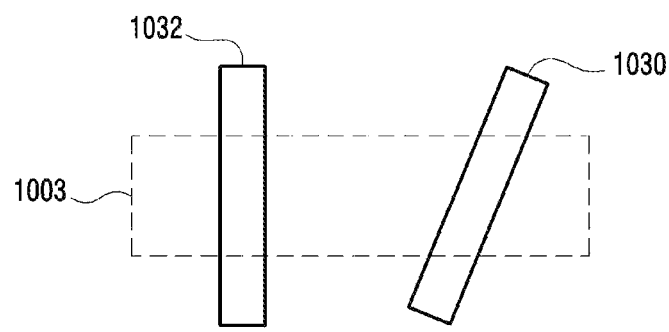

Referring to FIG. 10C, according to various embodiments, the foreign-matter infiltration prevention device may include a first foreign-matter infiltration prevention device 1030 disposed adjacent to a speaker in the sound passage 1003, and a second foreign-matter infiltration prevention device 1032 disposed adjacent to the speaker hole.

According to various embodiments, the foreign-matter infiltration prevention device may include a first foreign-matter infiltration prevention device 1030 disposed to be inclined in a northeast direction with respect to the sound passage 1003, and a second foreign-matter infiltration prevention device 1032 disposed in a vertical direction with respect to the sound passage 1003. The first and second foreign-matter infiltration prevention devices 1030 and 1032 may be disposed to be spaced apart from each other and to substantially face each other. Each of the first and second foreign-matter infiltration prevention devices 1030 and 1032 may be made of a mesh-type material, a metal grill-type material, or a combination thereof.

Figure 10D:
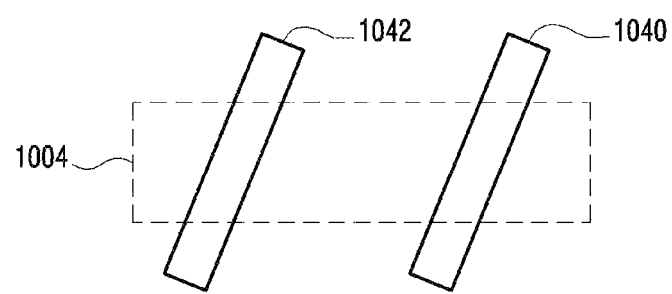

Referring to FIG. 10D, according to various embodiments, the foreign-matter infiltration prevention device may include a first foreign-matter infiltration prevention device 1040 disposed adjacent to a speaker in the sound passage 1004, and a second foreign-matter infiltration prevention device 1042 disposed adjacent to the speaker hole.

According to various embodiments, a foreign-matter infiltration prevention device may include a first foreign-matter infiltration prevention device 1040 arranged to be inclined to face the northeast direction with respect to the sound passage 1004, and a second foreign-matter infiltration prevention device 1042 disposed to be substantially inclined to face a northeast direction with respect to the sound passage 1004. The first and second foreign-matter infiltration prevention devices 1040 and 1042 may be disposed to be spaced apart from each other and to substantially face each other. Each of the first and second foreign-matter infiltration prevention devices 1040 and 1042 may be made of a mesh-type material, a metal grill-type material, or a combination thereof.

Figure 10E:
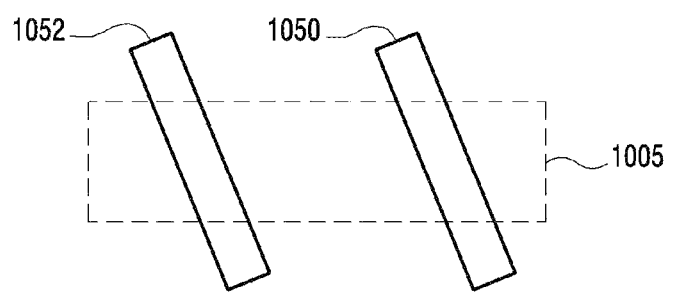

Referring to FIG. 10E, according to various embodiments, the foreign-matter infiltration prevention device may include a first foreign-matter infiltration prevention device 1050 disposed adjacent to a speaker in the sound passage 1005, and a second foreign-matter infiltration prevention device 1052 disposed adjacent to the speaker hole.

According to various embodiments, a foreign-matter infiltration prevention device may include a first foreign-matter infiltration prevention device 1050 arranged to be inclined to face the northwest direction with respect to the sound passage 1005, and a second foreign-matter infiltration prevention device 1052 disposed to be substantially inclined to face a northwest direction with respect to the sound passage 1005. The first and second foreign-matter infiltration prevention devices 1050 and 1052 may be disposed to be spaced apart from each other and to substantially face each other. Each of the first and second foreign-matter infiltration prevention devices 1050 and 1052 may be made of a mesh-type material, a metal grill-type material, or a combination thereof.

Figure 11:
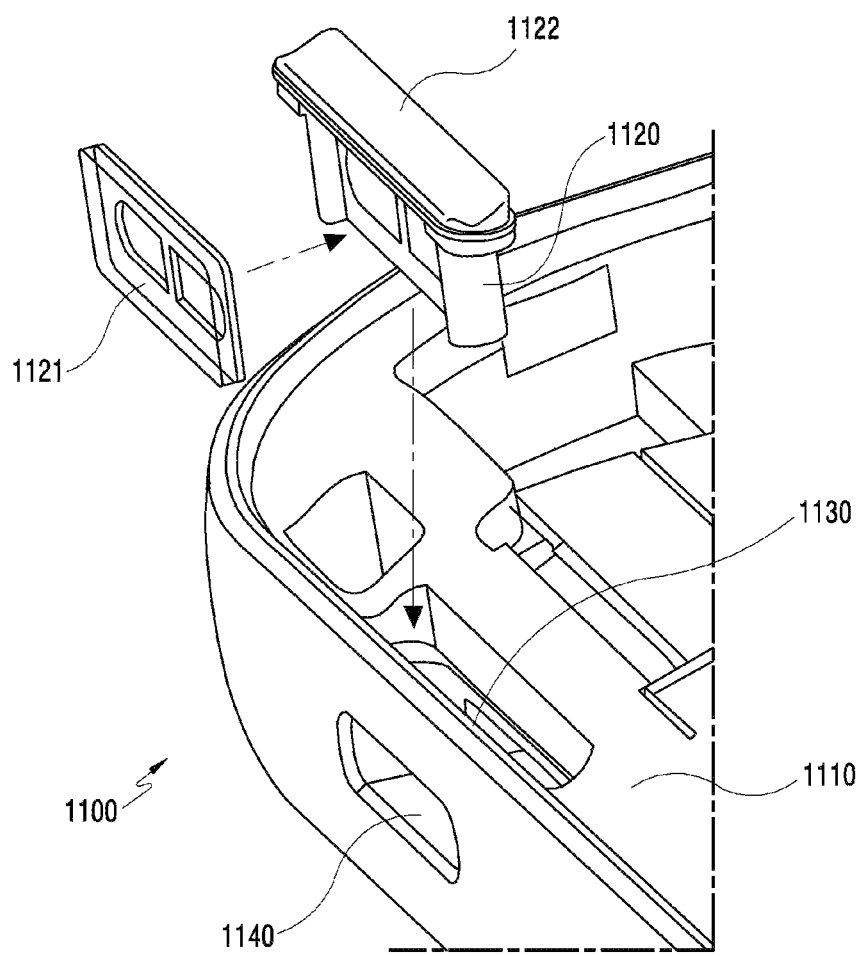
FIG. 11 is a perspective view illustrating an example state prior to mounting a foreign-matter infiltration prevention and/or reduction device that is mounted in a sound passage of the electronic device according to various example embodiments of the present disclosure.

FIG. 11 is a perspective view illustrating a state prior to mounting a foreign-matter infiltration prevention device that is mounted in a sound passage of the electronic device according to various example embodiments of the present disclosure.

Referring to FIG. 11, the foreign matter infiltration device disposed in the sound passage adjacent to or immediately before the speaker hole 1140 provided in the electronic device 1100 according to various embodiments may include a mesh unit 1121, a mounting body 1120, and a sealing portion 1122. The mesh unit 1121 is attached to the mounting body 1120 and is coupled to the seating recess 1130 formed in the case in front of the speaker hole 1140 so as to prevent foreign matter from infiltrating into the sound passage. The foreign-matter infiltration prevention device may be mounted by being coupled to the seating recess of the case 1110 in a vertical direction.

When the foreign-matter infiltration prevention device according to various embodiments is approximately vertically coupled to the seating recess 1130, the speaker hole 1140 faces the mesh unit 1121, and the sound passage may be sealed. For example, the foreign matter intrusion prevention device may be attached after the sealing portion 1122 is coupled to the mounting body 1120, the mesh unit 1121 is attached to the sealing portion 1122, and the mounting body 1120 is then coupled to the seating recess 1130.

Figure 12A:
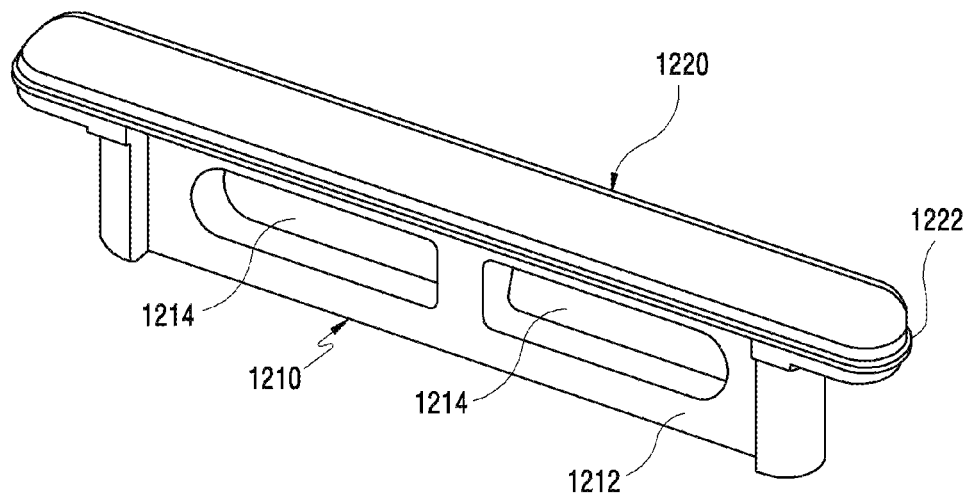
Figure 12B:
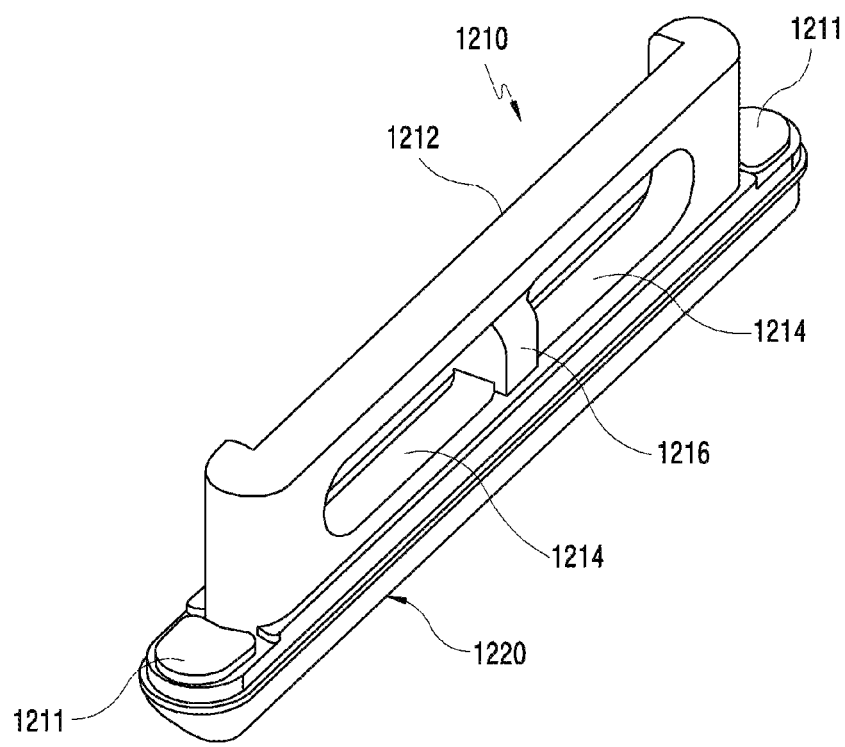
Figure 12C:
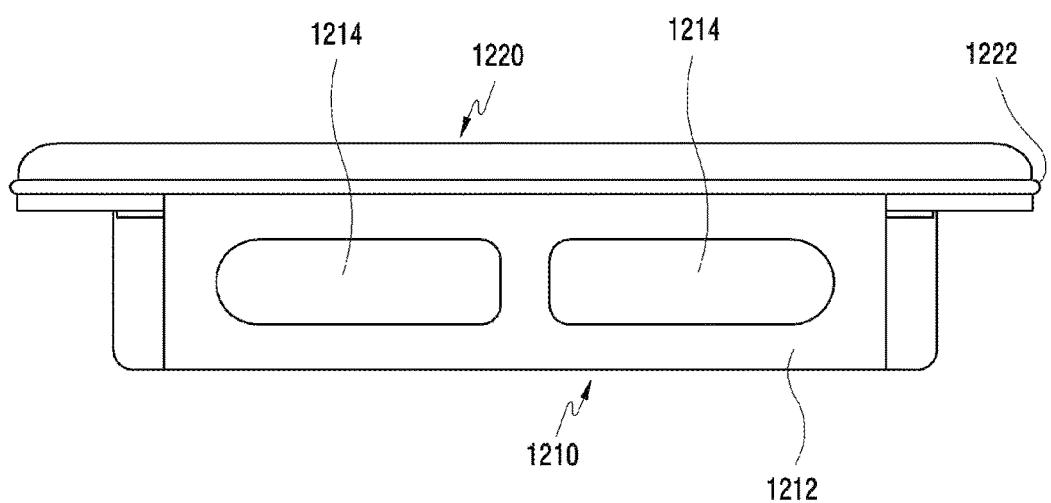
Figure 12D:
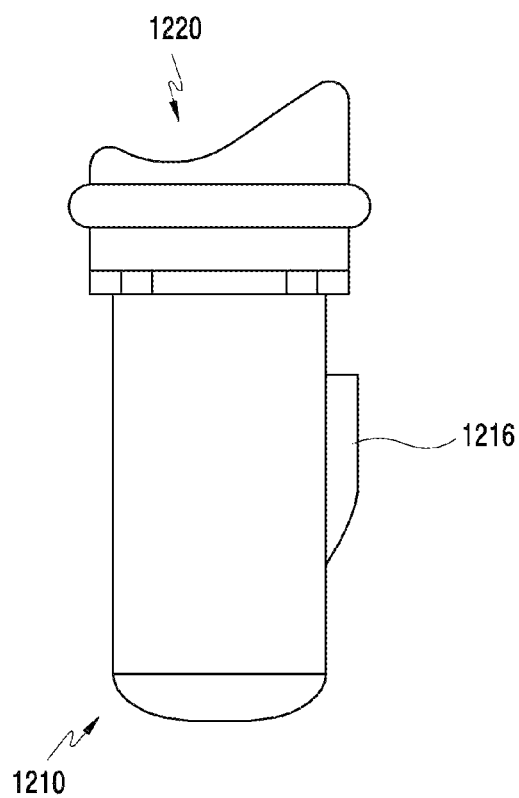

FIGS. 12A, 12B, 12C and 12D are diagrams illustrating examples of a mounting body according to various example embodiments of the present disclosure, in which FIG. 12A is a perspective view illustrating the mounting body in the state of being viewed downward from an upper side, FIG. 12B is a perspective view illustrating the mounting body in the state of being viewed upward from a lower side, FIG. 12C is a front view of the mounting body, and FIG. 12D is a side view of the mounting body.

Referring to FIGS. 12A to 12D, according to various embodiments, the foreign-matter infiltration prevention device may include a mounting body 1210, a cap 1220 coupled to the upper end of the mounting body 1210, a mesh seating portion 1212 formed on one face of the mounting body 1210, at least one opening 1214 formed in the mounting body 1210 to face the attached mesh that allows sound to pass therethrough, an engaging portion 1216 formed on the mounting body 1210, and a sealing structure 1222 formed in the cap 1220.

According to various embodiments, the mounting body 1210 may include an injection-molded material or a metal material. According to various embodiments, the cap 1220 may be made of a non-elastic material or an elastically deformable material such as silicon or rubber, and a sealing structure 1222 may be formed along the periphery thereof. The sealing structure 1222 has a protrusion shape and continuously extends continuously along the periphery of the cap 1220, and the sealing structure 1222 may prevent sound leakage by being tightly coupled with the case.

According to various embodiments, the mounting body 1210 may include a mesh seating portion 1212 that may be recessed in one face of the mounting body 1210 so that the mesh unit is seated therein, and one or more openings 1214 may be formed in the mounting body 1210. The openings 1214 may be configured in a structure having a bridge shape in one opening. The bridge shape supports the mesh in the form of a thin film so as to prevent the mesh from being deformed and damaged by strong water pressure or abnormal infiltration of an external object.

According to various embodiments, the mounting body 1210 may have a hook-shaped engagement portion 1216 formed on the other face thereof. The engagement portion 1216 is coupled to the case, so that the engagement portion 1216 may serve to fix the mounting body 1210. The engagement portion 1216 may be formed in a protruding shape on the other face between the respective openings 1214. Further, the engagement portion may be configured in the shape of a recess, and an engagement protrusion may be formed in the case.

According to various embodiments, the mounting body 1210 may have pieces of double-sided tape 1211, which are attached to the lower faces of the opposite ends thereof, respectively, so that the pieces of double-sided tape 1211 are capable of fixing the mounting body to the mounting recess in the case. Further, the pieces of double-sided tape may be configured in a structure attachable to the bottom of the cap 1220, and when the pieces of double-sided tape are attached in a closed curve shape enclosing the assembly surface, the pieces of double-sided tape are also able to perform a waterproofing function.

Figure 13A:
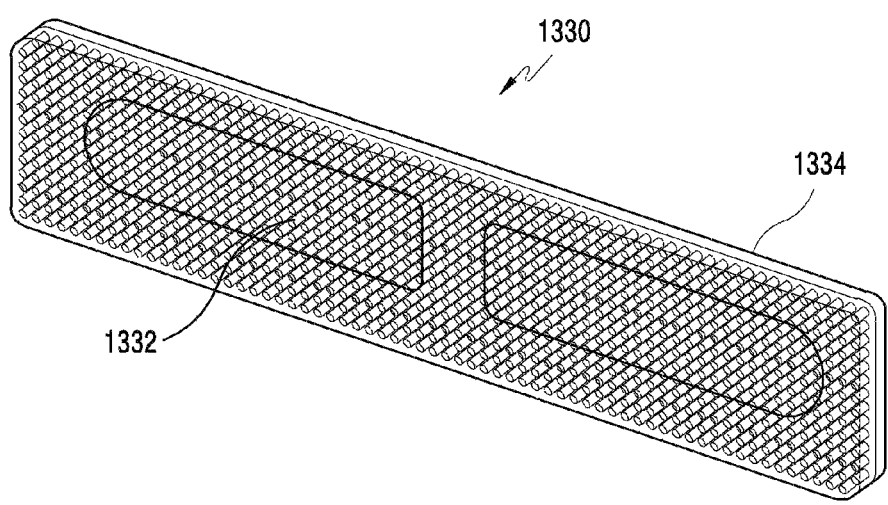
Figure 13B:
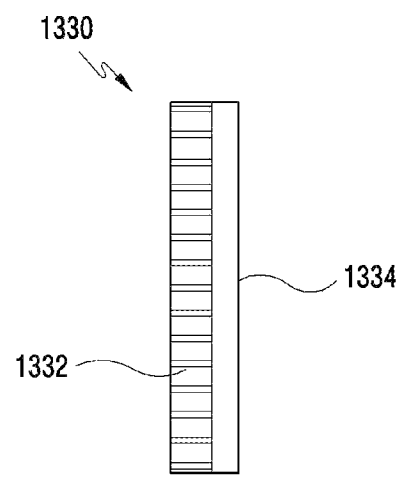

FIGS. 13A and 13B are diagrams illustrating an example mesh unit attached to the mounting body according to various example embodiments of the present disclosure, in which FIG. 13A is a perspective view of the mesh unit, and FIG. 13B is a side view of the mesh unit.

Referring to FIGS. 13A and 13B, according to various embodiments, a mesh unit 1330 may include a mesh 1332 and a piece of double-sided tape 1334 attached to one side of the mesh 1332. The piece of double-sided tape 1334 is formed in a shape corresponding to the remaining portion except for the opening portion formed in the mounting body, so that the double-sided tape 1334 can be attached to the seating recess in the mounting body.

Figure 14A:
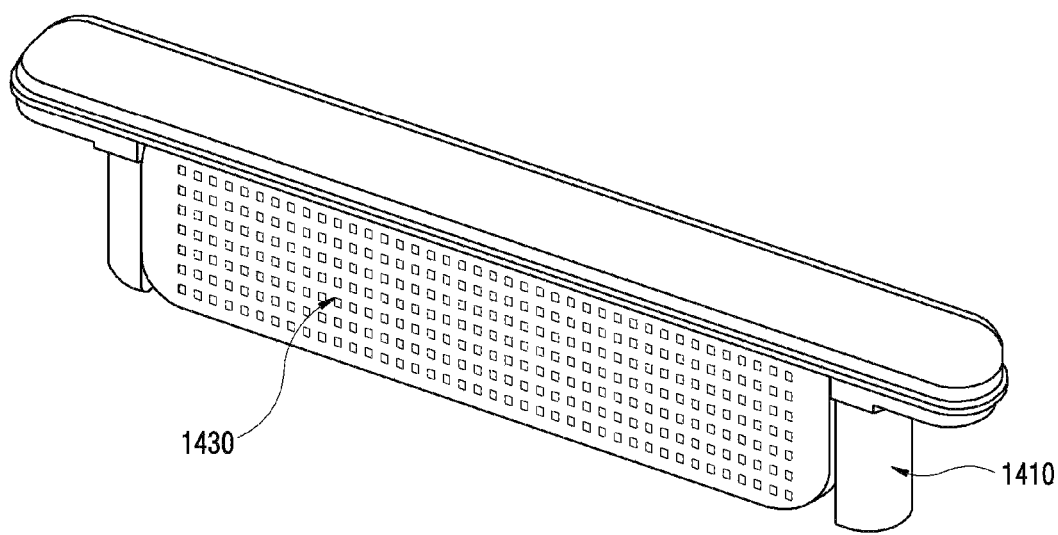
Figure 14B:
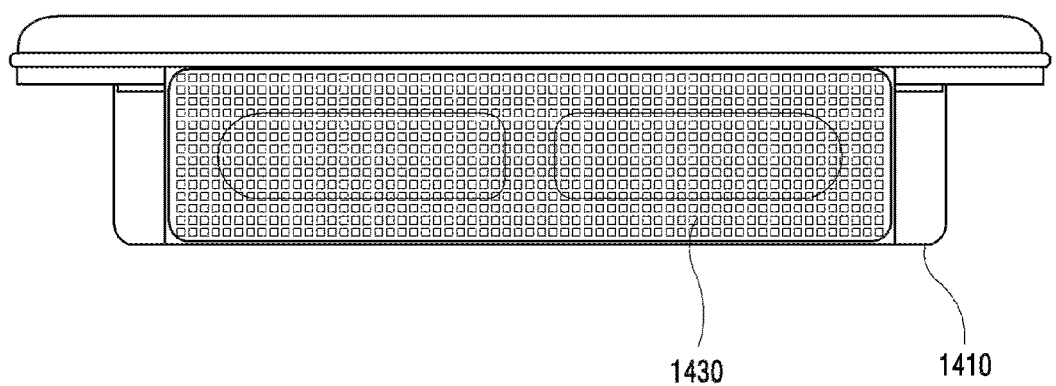

An example mounting body 1410, to which a mesh unit 1430 according to various example embodiments is attached, is illustrated in FIGS. 14A and 14B.

Figure 15A:
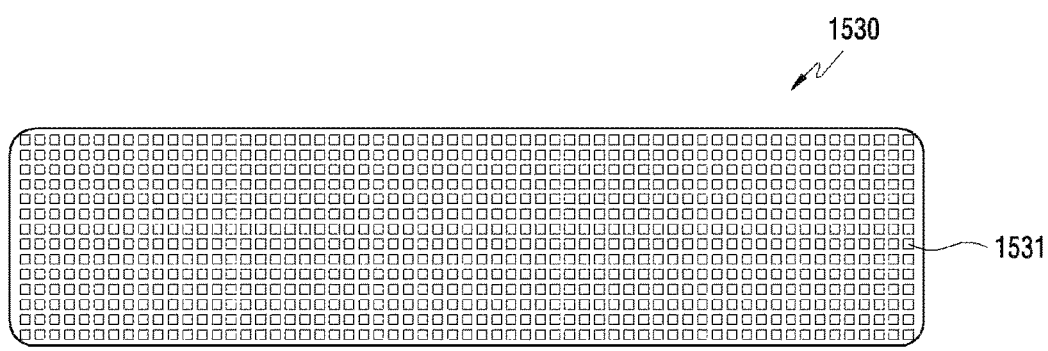
FIG. 15A is a front view illustrating an example mesh attached to a mounting body according to various example embodiments of the present disclosure.
Figure 15B:
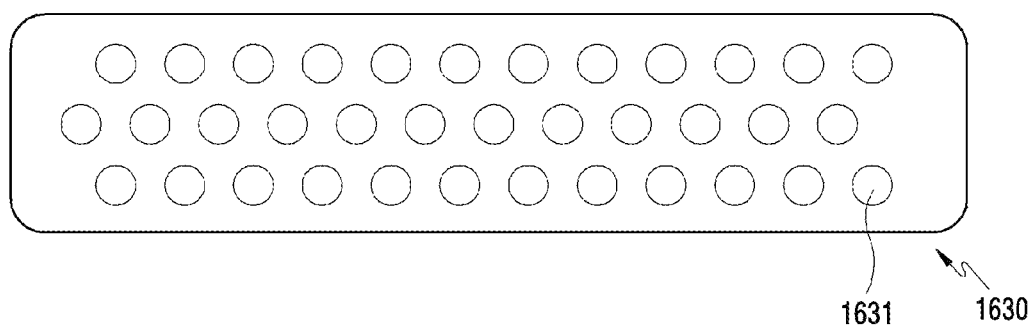
FIG. 15B is a front view illustrating an example grille attached to a mounting body according to various example embodiments of the present disclosure.

FIG. 15A is a front view illustrating an example mesh attached to a mounting body according to various example embodiments of the present disclosure. FIG. 15B is a front view illustrating an example grille attached to a mounting body according to various example embodiments of the present disclosure.

Referring to FIG. 15A, according to various embodiments, in a mesh unit 1530 attached to a mounting body, fine openings 1531 are arranged in a matrix shape so as to allow sound to pass therethrough while foreign matter is filtered without passing through the fine openings 1531. Two or more mesh units 1530, the opening sizes of which may be different from each other, may be stacked in multiple layers rather than in a single layer, and may be used by mounting the multiple-layered mesh units on the mounting body.

Referring to FIG. 15B, according to various embodiments, the mounting body may be provided not only with a mesh, but also with a grill 1630 made of a metal or a synthetic resin. The grill attached to the mounting body has a plurality of openings arranged in the widthwise and longitudinal directions such that sound can pass through the openings, while foreign matter can be filtered without passing through the openings. The size of each opening 1631 in the grill 1630 is made larger than the openings in the mesh and may be used to filter out foreign matter larger than dust.

Figure 16:
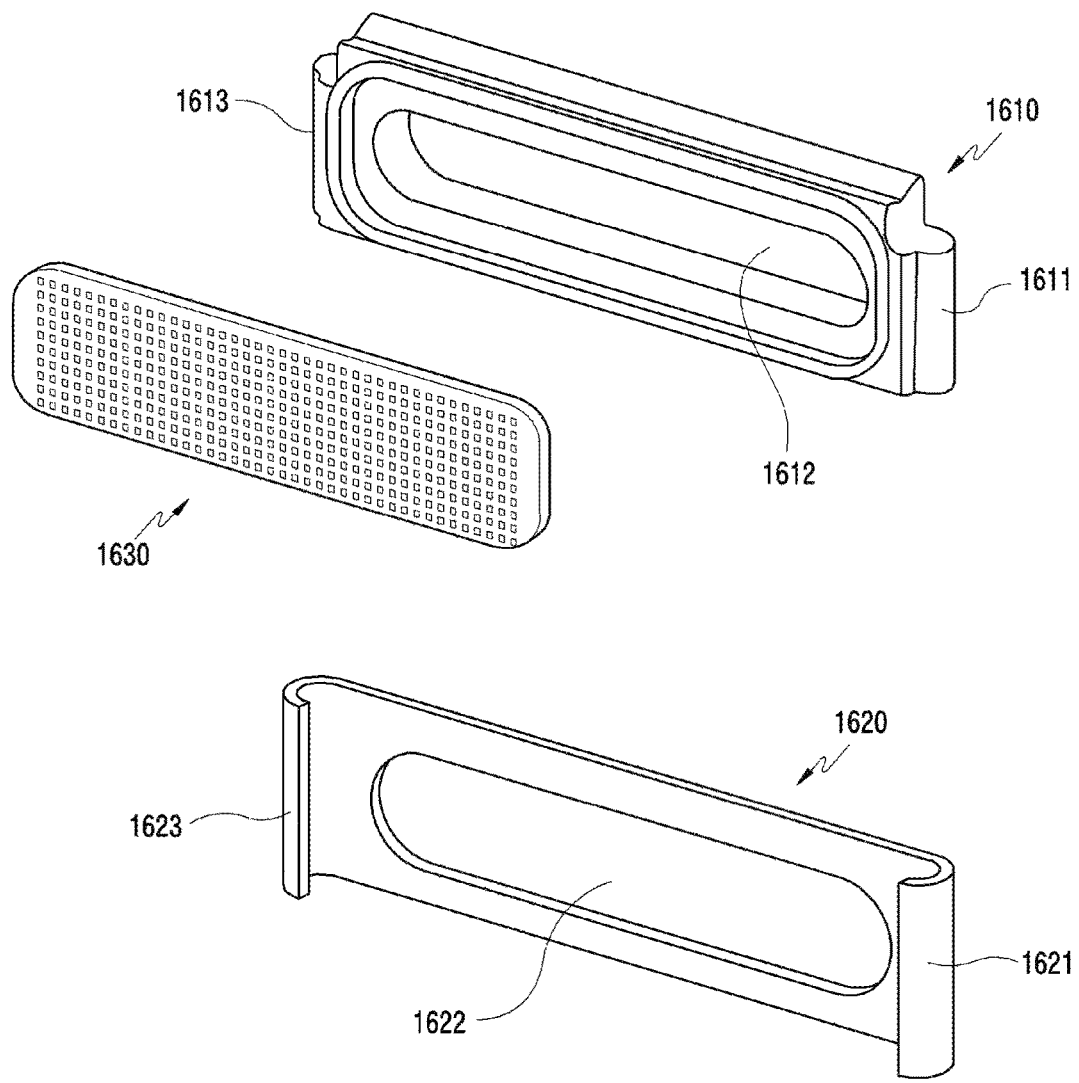
FIG. 16 is an exploded perspective view illustrating another example foreign-matter infiltration prevention and/or reduction device according to various example embodiments of the present disclosure.

FIG. 16 is an exploded perspective view illustrating another example foreign-matter infiltration prevention device according to various example embodiments of the present disclosure.

Referring to FIG. 16, according to various embodiments, a foreign-matter infiltration prevention device may include a mounting body 1610, a grill unit 1630, and a holding member 1620 that fixes the grill unit 1630 to one face of the mounting body 1610.

According to various embodiments, the mounting body 1610 may include one face and the other face. The grill unit 1630 may be mounted on the one face of the mounting body 1610 and the holding member 1620 may be mounted on the other face of the mounting body 1610 so that the grill unit 1630 can be constrained to the first face of the mounting body 1610. The mounting member 1610 may be formed with at least one opening 1612 that passes through the first and second faces. For example, the opening 1612 may be an aperture that is located in a sound passage so that sound may pass therethrough.

According to various embodiments, the holding member 1620 may be formed of an injection-molded material or a metal material, and an opening 1622 may be configured so as to enable sound to pass therethrough. On the opposite ends of the holding member 1620, first and second holding portions 1621 and 1623 having elasticity may be formed. Further, the elasticity of the first and second holding portions may be implemented by snap-fitting, riveting, adhesion, or the like.

For example, each of the first and second holding portions 1621 and 1623 may be formed in a bent shape to hold the grill unit 1630 mounted on the mounting body 1610. To this end, the opposite ends of the mounting body 1610 may be formed with first and second portions 1611 and 1613 to which the holding portions 1621 and 1623 are coupled.

Figure 17A:
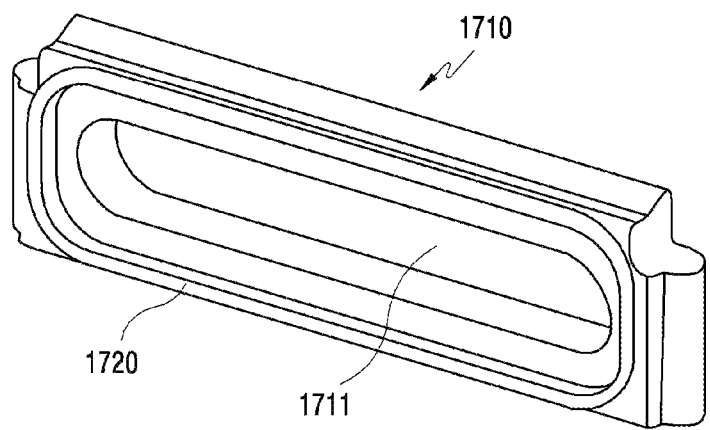
Figure 17B:
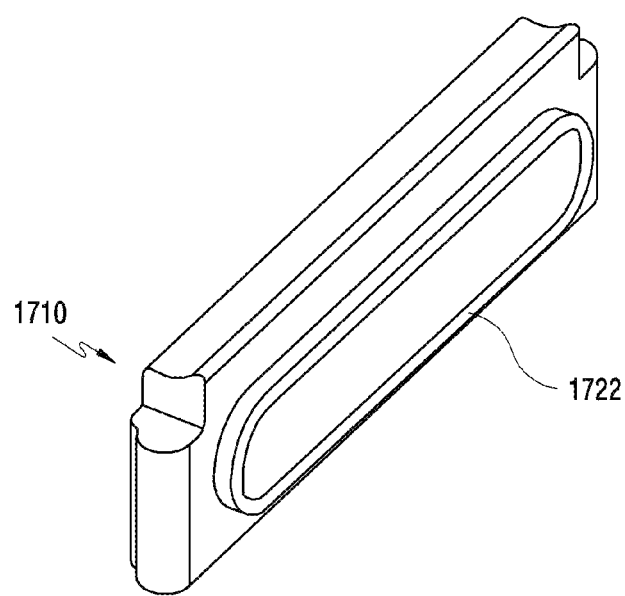
Figure 17C:
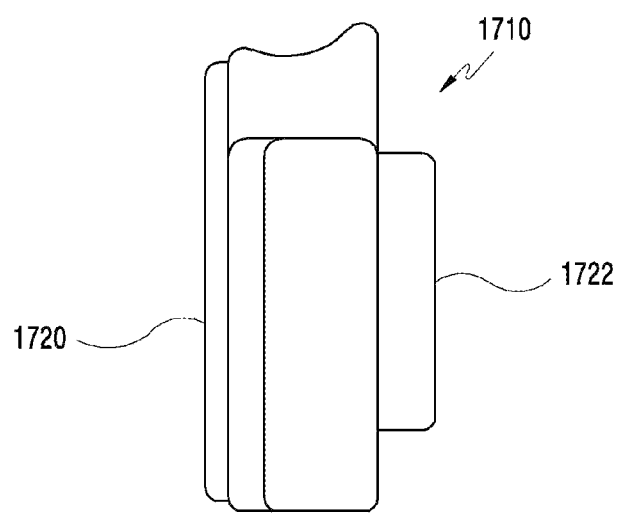

FIGS. 17A, 17B and 17C are diagrams illustrating an example mounting body of a foreign-matter infiltration prevention device according to various example embodiments of the present disclosure, in which FIGS. 17A and 17B are perspective views each illustrating the mounting body and FIG. 17C is a side view of the mounting body.

Referring to FIGS. 17A to 17C, according to various embodiments, the mounting body may be formed with at least one sound leakage prevention device. For example, a first sealing device 1720 may be formed on one face of the mounting body 1710, and a second sealing device 1722 may be formed on the other face thereof. The sealing devices may be provided in the foreign-matter infiltration prevention device and may perform a function of sealing the sound passage between a speaker and a speaker hole, that is, inside a sound duct.

According to various embodiments, the first sealing device 1720 may be formed in a protrusion shape around an opening 1711 on the one face of the mounting body 1710. The first sealing device 1720 may be inserted into a corresponding first coupling recess formed in the case (to be described later) to be in close contact with the first coupling recess. The first sealing device 1720 may protrude in the speaker hole direction, and may extend around the opening 1711 in a closed curve shape. The first sealing device 1720 may perform a waterproofing function.

According to various embodiments, the second sealing device 1722 may extend along the opening 1711 on the other face of the mounting body 1710, and may be formed in a protrusion shape. The second sealing device 1722 may be inserted into a corresponding second coupling recess (to be described later) formed in the case to be in close contact with the second coupling recess. The second sealing device 1722 may perform a waterproofing function.

According to various embodiments, the second sealing device 1722 may be opposite the first sealing device 1711. The second sealing device 1722 may protrude in the speaker direction, and may be formed in a closed curve shape. The first and second sealing devices 1720 and 1722 may be configured to have the same shape, similar shapes, or different shapes. For example, the first sealing device 1720 may be configured to be slightly larger than the second sealing device 1722.

Figure 18:
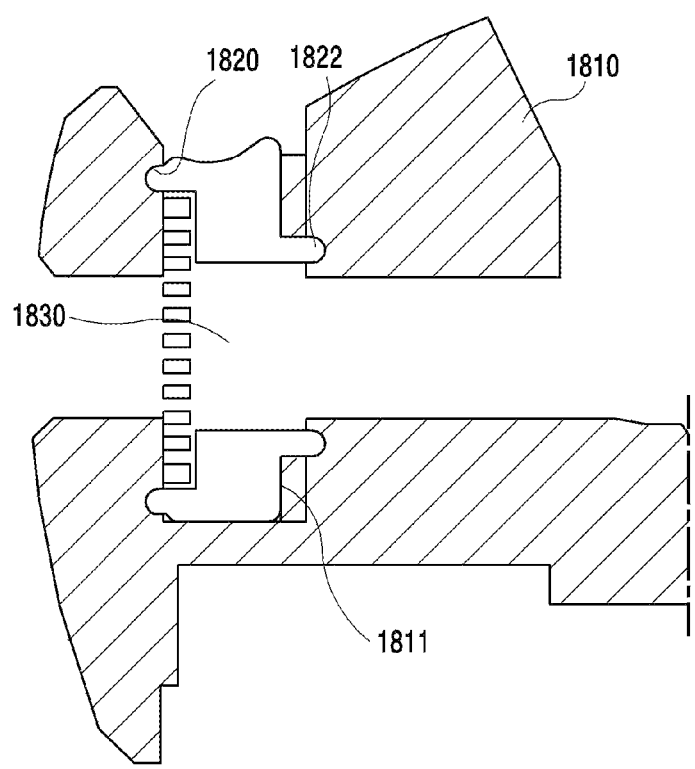
FIG. 18 is a sectional view illustrating the state in which another example foreign-matter infiltration prevention and/or reduction device according to various example embodiments of the present disclosure is mounted in a case.

FIG. 18 is a diagram illustrating a state in which the example foreign-matter infiltration prevention device including the first and second sealing devices are mounted on the seating recess in the case according to an example embodiment of the present disclosure.

FIG. 18 is a cross-sectional view illustrating the state in which another foreign-matter infiltration prevention device according to various embodiments of the present disclosure is mounted in a case.

Referring to FIG. 18, the first and second sealing devices 1820 and 1822 provided on the mounting body may be assembled in the vertical direction and mounted on the case 1810. The seating recess 1811 for mounting the foreign-matter infiltration prevention device in the vertical direction may be substantially orthogonal to a sound duct forming a sound passage 1830. The seating recess 1811 is a mounting space recessed in a direction perpendicular to the case 1810, so that the first and second sealing devices 1820 and 1822 may be forcedly assembled in the vertical direction to be seated.

Figure 19A:
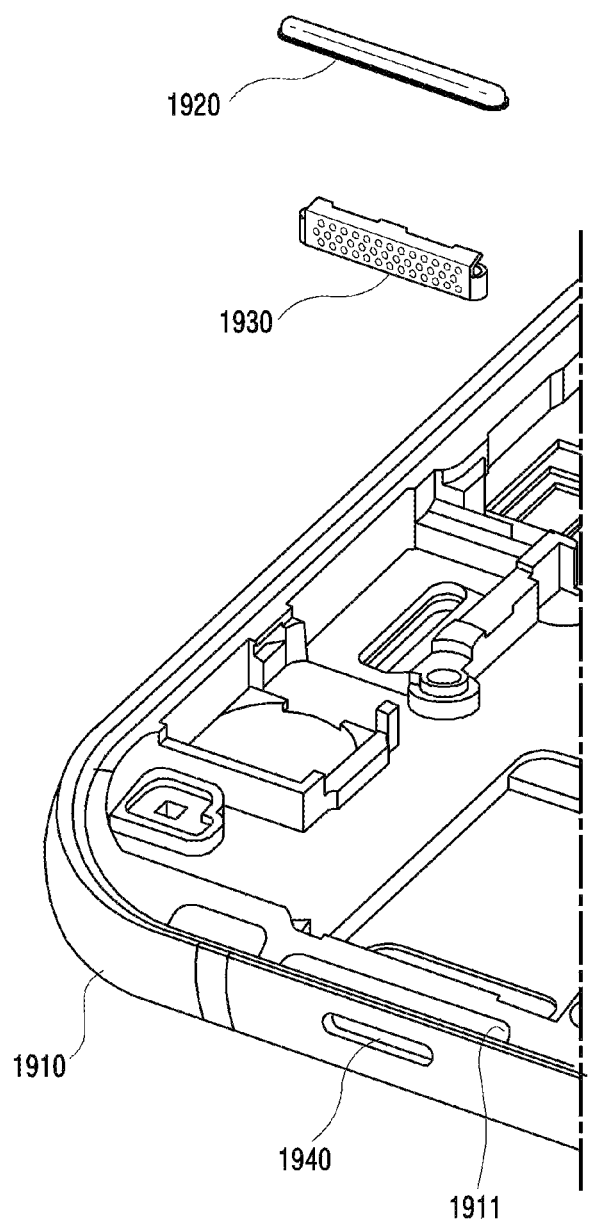
FIG. 19A is an exploded perspective view illustrating still another example foreign-matter infiltration prevention and/or reduction device according to various example embodiments of the present disclosure.

FIG. 19A is an exploded perspective view illustrating still another example foreign-matter infiltration prevention device according to various example embodiments of the present disclosure, and FIG. 19 is a cross-sectional view illustrating the coupled state of the example foreign-matter infiltration prevention device according to various example embodiments of the present disclosure.

Figure 19B:
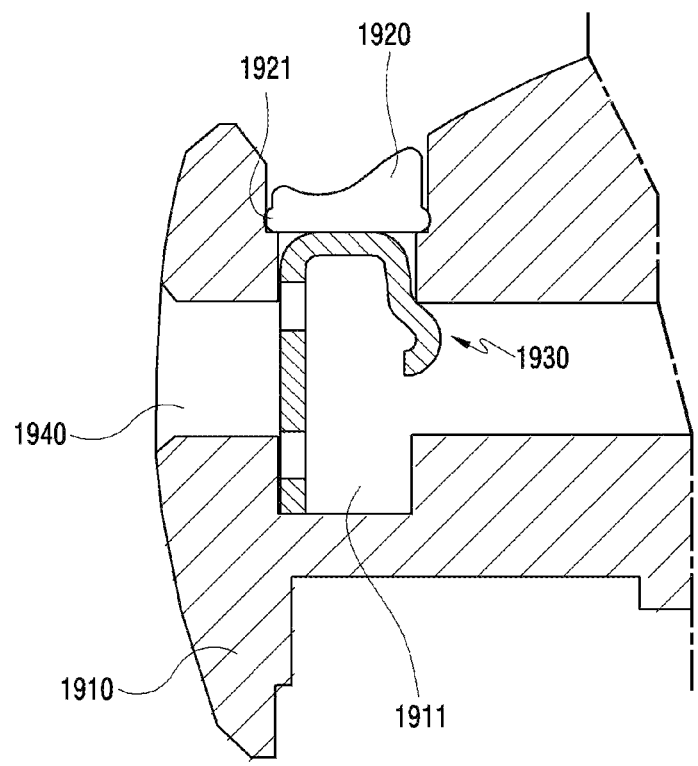
FIG. 19B is a cross-sectional view illustrating the coupled state of the example foreign-matter infiltration prevention and/or reduction device according to various example embodiments of the present disclosure.

Referring to FIGS. 19A and 19B, according to various embodiments, the foreign-matter infiltration prevention device may be mounted by being vertically coupled to the seating recess 1911 in the housing 1910. The foreign-matter infiltration prevention device may include a cover 1920 and a grill unit 1930. The foreign-matter infiltration prevention device may be vertically mounted to the entrance just before the speaker hole 1940 in the housing. A vertically recessed mounting recess may be formed in the inner opening of the speaker hole in the housing, and the foreign-matter infiltration prevention device may be coupled to the mounting recess, so that the grill unit may be vertically arranged with respect to the sound passage.

According to various embodiments, the cover 1920 may be a sealing member, and may be provided with a sealing device 1921. Since the sealing device 1921 has the same configuration as the sealing device 1222 provided in the second foreign-matter infiltration prevention device illustrated in FIGS. 12A to 12D, a description thereof will not be repeated here in order to avoid a duplicate description.

Figure 20A:
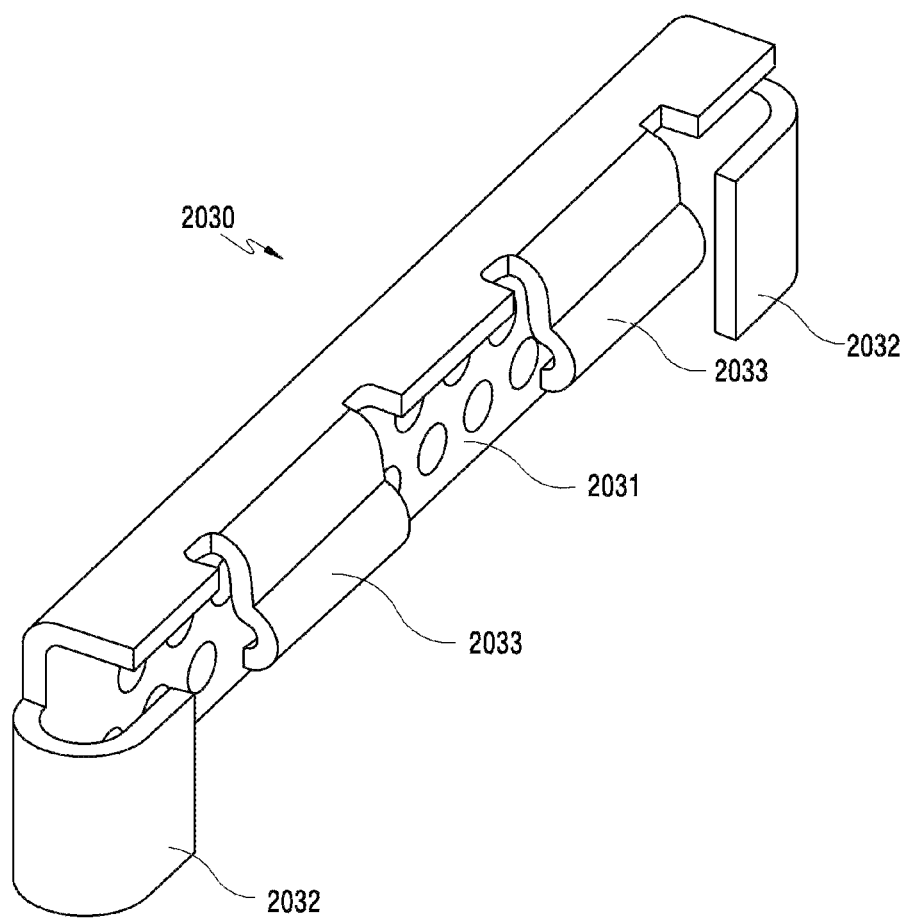
Figure 20B:
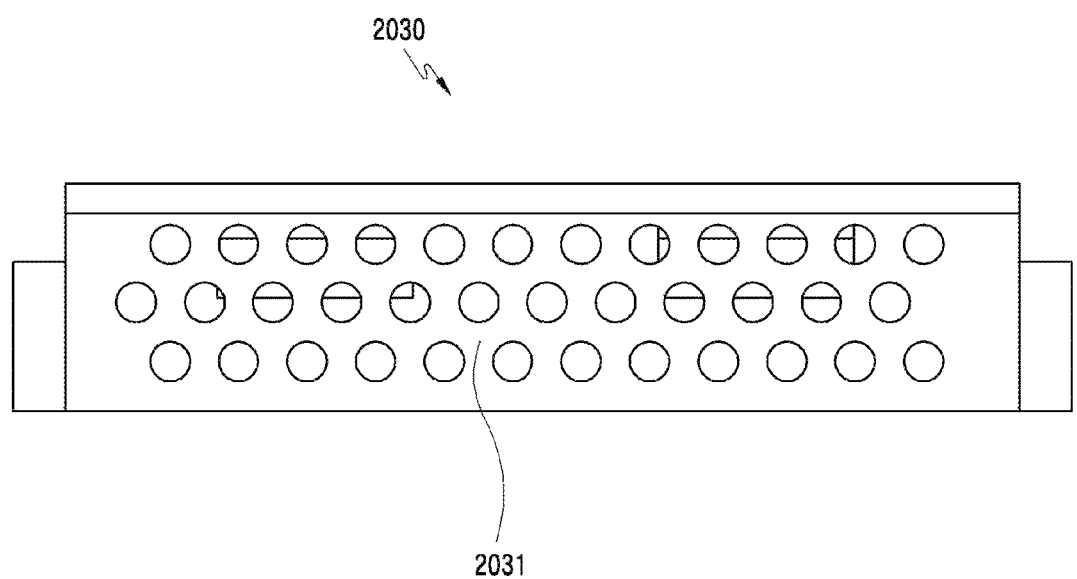

FIGS. 20A and 20B are diagrams each illustrating examples of a mounting body employed in yet another foreign-matter infiltration prevention device according to various example embodiments of the present disclosure, in which FIG. 20A is a perspective view of the mounting body and FIG. 20B is a front view of the mounting body.

Referring to FIGS. 20A and 20B, according to various embodiments, a grill unit 2030 may include a grill 2031, and one or more holding members that provide force to couple the grill 2031 to the mounting groove. The one or more holding members are integrally formed in the grille 2031, and may be made of a metal material.

According to various embodiments, the holding member may include side holding portions 2032 formed at the opposite ends of the grill 2031 and an upper holding portion 2033 formed at the upper end of the grill 2031. The side holding portions 2032 are formed by a bending process at the opposite ends of the grille 2031, and may support the grill 2031 to the case at the opposite ends. The upper holding portion 2033 may be manufactured by bending the grill 2031, and may be coupled to the case to support the grill 2031 at the upper end. Two upper holding portions 2033 may be symmetrically arranged, and each of the upper holding portions 2033 may be bent and arranged to face downwards. Each of the side holding portions 2032 and the upper holding portion 2033 may be formed to have elasticity so that they can be forcibly fitted to the seating recesses. After the grill unit 2030 is mounted in the seating recess, the cover (see FIG. 19A) is engaged with the upper portion of the grill unit so that the mounting of the foreign-matter infiltration prevention device is completed, and the prevention of sound leakage may be implemented by the cover.

While the present disclosure has been illustrated and described with reference to various example embodiments thereof, it will be understood by those of ordinary skill in the art that various changes in form and details may be made therein without departing from the spirit and scope of the disclosure as defined by the appended claims and their equivalents. The various example embodiments should be considered in a descriptive sense only and not for purposes of limitation. Therefore, the scope of the disclosure is defined not by the detailed description of the disclosure but by the appended claims and their equivalents, and all differences within the scope will be understood as being included in the present disclosure.

What is claimed is:

1. An electronic device comprising:
a housing including a first face facing a first direction, a second face facing a second direction opposite the first direction, a side face facing a third direction perpendicular to each of the first and second directions and surrounding at least a portion of a space between the first and second faces;
a first plate disposed on the first face and exposed in the first direction; and
a second plate disposed on the second face and exposed in the second direction,
wherein the first plate includes a plurality of first edge regions, wherein at least one of the first edge regions includes, in at least a portion thereof, at least one first curved region that curves toward the second plate and/or toward a side face, and
at least one speaker hole disposed on the side face between the first curved region and the second plate, wherein the side face is not part of the first plate and is not part of the second plate.

2. An electronic device comprising:
a housing including a first face facing a first direction, a second face facing a second direction opposite the first direction, a side face facing a third direction perpendicular to each of the first and second directions and surrounding at least a portion of a space between the first and second faces;
a first plate disposed on the first face and exposed in the first direction; and
a second plate disposed on the second face and exposed in the second direction,
wherein the first plate includes a plurality of first edge regions, wherein at least one of the first edge regions includes, in at least a portion thereof, at least one first curved region that curves toward the second plate and/or toward a side face,
at least one speaker hole disposed on the side face between the first curved region and the second plate, and
wherein the first plate includes a rear cover of the electronic device.

3. The electronic device of claim 1, wherein the first plate includes a display device of the electronic device.

4. The electronic device of claim 1, wherein the first edge regions include any one of: a first upper edge region extending along the side face, a first lower edge region extending along the side face, and a first side edge region extending along the side face.

5. The electronic device of claim 1, wherein the second plate includes a plurality of second edge regions,
at least one of the second edge regions includes, in at least a portion thereof, at least one second curved region extending in the third direction, and
the speaker hole is disposed in the side face between the first and second curved regions.

6. The electronic device of claim 5, wherein the second edge regions include any one of: a second upper edge region extending along the side face, a second lower edge region extending along the side face, and a second side edge region extending along the side face.

7. The electronic device of claim 1, wherein the speaker hole comprises at least one of: a single speaker hole extending in the third direction and a plurality of speaker holes arranged in the third direction.

8. The electronic device of claim 1, further comprising:
a case disposed between the first and second faces;
a display device supported by the case to face the first direction; and
a printed circuit board including a speaker disposed thereon and supported by the case to face the second direction,
wherein at least one foreign matter infiltration prevention/reduction structure is disposed in a sound passage between the speaker hole and the speaker.

9. An electronic device comprising:
a housing including a first face facing a first direction, a second face facing a second direction opposite the first direction, a side face facing a third direction perpendicular to each of the first and second directions and surrounding at least a portion of a space between the first and second faces;
a first plate disposed on the first face and exposed in the first direction; and
a second plate disposed on the second face and exposed in the second direction,
wherein the first plate includes a plurality of first edge regions, wherein at least one of the first edge regions includes, in at least a portion thereof, at least one first curved region that curves toward the second plate and/or toward a side face,
at least one speaker hole disposed on the side face between the first curved region and the second plate,
a case disposed between the first and second faces;
a display device supported by the case to face the first direction; and
a printed circuit board including a speaker disposed thereon and supported by the case to face the second direction,
wherein at least one foreign matter infiltration prevention/reduction structure is disposed in a sound passage between the speaker hole and the speaker,
wherein the foreign matter infiltration prevention/reduction structure includes a first foreign-matter infiltration prevention/reduction device disposed in the case adjacent to the speaker, and is inclined with respect to the speaker hole, and a second foreign matter prevention/reduction device disposed in the case adjacent to the speaker hole, spaced apart from the first foreign-matter infiltration prevention device, and facing the speaker hole.

10. The electronic device of claim 9, wherein the first foreign matter infiltration prevention/reduction structure is disposed to be inclined with respect to the sound passage, and the second foreign matter prevention/reduction structure is disposed in a direction perpendicular to the sound passage.

11. The electronic device of claim 9, wherein the second foreign matter infiltration prevention/reduction structure includes:
a mounting body;
a sealing portion at an upper end of the mounting body;
a mesh mounting portion on one face of the mounting body facing the speaker hole;
at least one opening formed in the mounting body configured to enable sound to pass therethrough and disposed in the sound passage;
an engagement portion on the mounting body and configured to fix the mounting body to the case; and
a sound leakage prevention/reduction device on the sealing portion and configured to seal the sound passage upon being coupled to the case.

12. The electronic device of claim 11, wherein the sound leakage prevention/reduction device includes a protrusion portion extending along a periphery of the sealing portion, a closed curve shape, and protrudes outwardly parallel to the sound passage.

13. The electronic device of claim 9, wherein the second foreign matter infiltration prevention/reduction structure includes:
a mounting body including a first face and a second face opposite the first face, at least one opening configured to pass sound, and at least one sound leakage prevention/reduction device sealing the sound passage;
a grill mounted on the first face; and
a holding member including first and second holding portions having elasticity and being coupled to the second face, and configured to fix the grill unit to the first face of the mounting body by the first and second holding portions.

14. The electronic device of claim 13, wherein the at least one sound leakage prevention/reduction device includes a first sound leakage prevention/reduction device disposed in the first face of the mounting body and a second sound leakage prevention/reduction device disposed in the second face of the mounting body,
the first sound leakage prevention/reduction device is configured to include a protrusion having a first closed curve shape extending along a circumference of the opening formed in the mounting body, and
the second sound leakage prevention/reduction device is configured to include a protrusion having a second closed curve shape extending along the opening in the second face of the mounting body.

15. The electronic device of claim 14, wherein the case includes a first mounting recess outwardly projecting to couple the first sound leakage prevention/reduction device thereto, and a second mounting recess protruding inwardly to couple the second sound leakage prevention/reduction device thereto, and
the first and second mounting recesses face each other.

16. An electronic device comprising:
a housing including a first face facing a first direction, a second face facing a second direction opposite the first direction, a side face facing a third direction perpendicular to each of the first and second directions and surrounding at least a portion of a space between the first and second faces;

a display device disposed on the first face and exposed in the first direction;

a cover disposed on the second face and exposed in the second direction;

a case disposed between the first and second faces and supporting the display device exposed in the first direction; and a printed circuit board facing the second direction, having a speaker mounted thereon and supported by the case, wherein the cover includes a flat portion, and at least one edge region surrounding the flat portion, the at least one edge region including, in at least a portion thereof, a first curved region, and at least one speaker hole disposed on a side face between the first curved region and the first face, wherein the display device includes a flat display region, and at least one curved display region at least partially surrounding a circumference of the flat display region, and the speaker hole is disposed between the curved display region and the first curved region.

17. An electronic device comprising:

a housing including a first face facing a first direction, a second face facing a second direction opposite the first direction, a side face facing a third direction perpendicular to each of the first and second directions and surrounding at least a portion of a space between the first and second faces;

a display device disposed on the first face and exposed in the first direction;

a cover disposed on the second face and exposed in the second direction;

a case disposed between the first and second faces and supporting the display device exposed in the first direction; and a printed circuit board facing the second direction, having a speaker mounted thereon and supported by the case, wherein the cover includes a flat portion, and at least one edge region surrounding the flat portion, the at least one edge region including, in at least a portion thereof, a first curved region, at least one speaker hole disposed on a side face between the first curved region and the first face, first and second foreign matter infiltration prevention/reduction devices installed in a sound passage, provided between the speaker hole and the speaker, and spaced apart from each other, wherein one of the first and second foreign-matter infiltration prevention/reduction devices includes a sound leakage prevention/reduction configured to seal the sound passage.

18. The electronic device of claim 17, wherein the first foreign matter infiltration prevention/reduction device is disposed in at least one of a vertical direction and an inclined direction with respect to the sound passage, and the second foreign matter prevention/reduction device is disposed in at least one of a vertical direction and an inclined direction with respect to the sound passage.

19. The electronic device of claim 18, wherein the curved region is positioned on a side face of the housing, and the curved display region is positioned on a side face of the housing.

* * * * *